(12) United States Patent
Hazue

(10) Patent No.: US 11,849,579 B2
(45) Date of Patent: Dec. 19, 2023

(54) SEMICONDUCTOR STORAGE DEVICE AND METHOD FOR MANUFACTURING THE SAME

(71) Applicant: Kioxia Corporation, Tokyo (JP)

(72) Inventor: Shunsuke Hazue, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 91 days.

(21) Appl. No.: 17/190,725

(22) Filed: Mar. 3, 2021

(65) Prior Publication Data
US 2022/0045085 A1    Feb. 10, 2022

(30) Foreign Application Priority Data

Aug. 5, 2020  (JP) .................................. 2020-132863

(51) Int. Cl.
| | | |
|---|---|---|
| *H10B 43/20* | (2023.01) | |
| *H10B 41/10* | (2023.01) | |
| *H10B 41/20* | (2023.01) | |
| *H10B 41/35* | (2023.01) | |
| *H10B 43/10* | (2023.01) | |
| *H10B 43/35* | (2023.01) | |

(52) U.S. Cl.
CPC ............. *H10B 43/20* (2023.02); *H10B 41/10* (2023.02); *H10B 41/20* (2023.02); *H10B 41/35* (2023.02); *H10B 43/10* (2023.02); *H10B 43/35* (2023.02)

(58) Field of Classification Search
CPC ........ H10B 43/20; H10B 41/20; H10B 43/10; H10B 43/27; H10B 51/00; H10B 41/10; H10B 41/35; H10B 43/35; H10B 43/50; H10B 41/27; H01L 27/11578; H01L 27/11551; H01L 27/11565; H01L 27/11582; H01L 27/11585; H01L 27/11519; H01L 27/11524; H01L 27/1157; H01L 27/11575; H01L 27/11556

See application file for complete search history.

(56) References Cited

U.S. PATENT DOCUMENTS

| | | | |
|---|---|---|---|
| 10,937,800 B2 * | 3/2021 | Kim | ..................... H01L 21/308 |
| 11,133,192 B2 * | 9/2021 | Tabata | ................. H01L 21/6833 |

(Continued)

FOREIGN PATENT DOCUMENTS

| | | |
|---|---|---|
| JP | H464217 A | 2/1992 |
| JP | 2000-133788 A | 5/2000 |

(Continued)

*Primary Examiner* — Shahed Ahmed
*Assistant Examiner* — Khatib A Rahman
(74) *Attorney, Agent, or Firm* — Foley & Lardner LLP

(57) ABSTRACT

A semiconductor storage device includes a stacked portion including an insulating layer and a conductor layer that are alternately stacked, and a plurality of memory pillars extending into the stacked portion. When viewed along a direction perpendicular to a surface of the stacked portion, the stacked portion includes a first area in which the plurality of memory pillars are provided, and a second area adjacent to the first area and free of the memory pillars. The first memory pillar of the plurality of memory pillars formed at a position closest to a boundary between the first area and the second area and a second memory pillar of the plurality of memory pillars that is adjacent to the first memory pillar have the same width.

8 Claims, 19 Drawing Sheets

(56) References Cited

U.S. PATENT DOCUMENTS

| | | | |
|---|---|---|---|
| 11,145,670 B2* | 10/2021 | Yoshimizu | ............. H10B 43/27 |
| 2005/0045993 A1 | 3/2005 | Okuda et al. | |
| 2018/0330948 A1* | 11/2018 | Kwon | ................. H01L 21/0332 |
| 2020/0212059 A1 | 7/2020 | Nishikawa | |

FOREIGN PATENT DOCUMENTS

| | | |
|---|---|---|
| JP | 2005-079200 A | 3/2005 |
| JP | 2015-176103 A | 10/2015 |
| JP | 2015-181910 A | 10/2015 |
| TW | 202025155 A | 7/2020 |

* cited by examiner

SEMICONDUCTOR STORAGE DEVICE AND METHOD FOR MANUFACTURING THE SAME

CROSS-REFERENCE TO RELATED APPLICATION(S)

This application is based upon and claims the benefit of priority from Japanese Patent Application No. 2020-132863, filed on Aug. 5, 2020, the entire contents of which are incorporated herein by reference.

FIELD

Embodiments described herein relate generally to a semiconductor storage device, and a method manufacturing the same.

BACKGROUND

For example, a semiconductor storage device such as a NAND type flash memory is provided with columnar memory pillars so as to penetrate a stacked portion in which a plurality of insulating layers and conductor layers are alternately stacked. In each of the memory pillars, a plurality of memory cells configured to store information is formed along a longitudinal direction.

DETAILED DESCRIPTION

Figure 1:
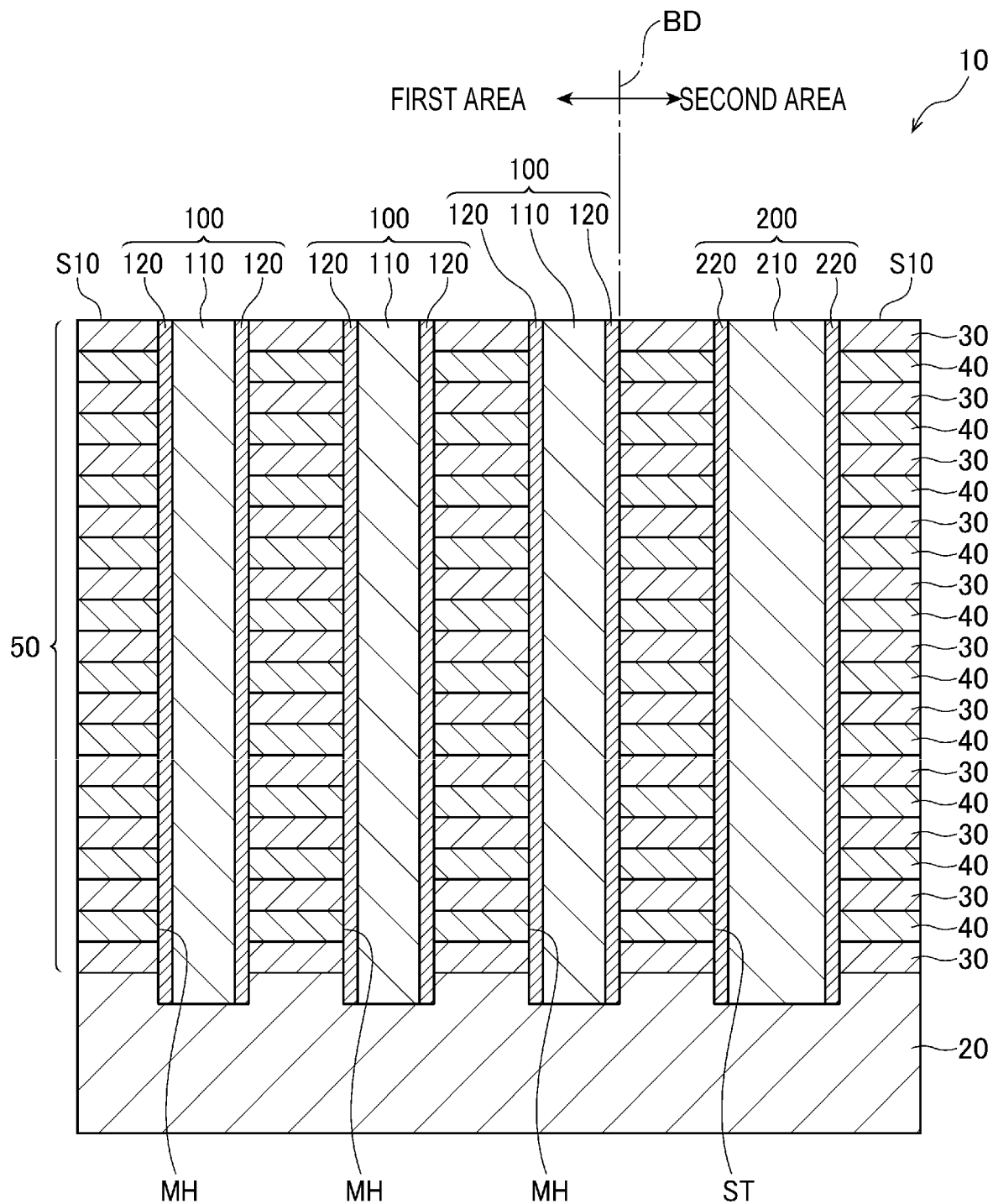
FIG. 1 is a cross-sectional view illustrating a configuration of a semiconductor storage device according to an embodiment.

In manufacturing the semiconductor storage device having the above configuration, it is necessary to form a plurality of recesses, that is, memory holes in which the memory pillars are to be disposed by performing etching on a portion to be the stacked portion. At this time, due to the influence of the so-called "loading effect", the etching rate tends to be lower in the recess formed in the end portion of the area in which the plurality of recesses are formed as compared with the other recesses.

For example, when the inner diameter of the recess formed in the end portion is formed to be larger than the inner diameter of the other recesses by, for example, performing OPC correction (optical proximity correction) on a mask used for etching, it is possible to make the etching rates of all the recesses evenly close to each other. However, since recent semiconductor storage devices are required to be miniaturized and highly integrated at a high level, it is not desirable to increase the shape of some recesses.

Embodiments provide a semiconductor storage device capable of reducing the influence of the loading effect in the manufacturing, and a method for manufacturing the same.

In general, according to one embodiment, a semiconductor storage device related to the present disclosure includes a stacked portion in which an insulating layer and a conductive layer are alternately stacked, and a plurality of memory pillars penetrating the stacked portion. When viewed along a direction perpendicular to a surface of the stacked portion, the stacked portion includes a first area that is a portion in which the plurality of memory pillars are provided, and a second area that is a portion adjacent to the first area, and is a portion in which the memory pillar is not provided. When the memory pillar formed at a position closest to a boundary between the first area and the second area is defined as a first memory pillar, and the memory pillar formed at a position adjacent to the first memory pillar along a direction perpendicular to the boundary is defined as a second memory pillar, a width of the first memory pillar in the surface of the stacked portion and a width of the second memory pillar on the surface are the same as each other.

Further, according to another embodiment, a method for manufacturing a semiconductor storage device related to the present disclosure includes: a step of forming a workpiece by alternately stacking an insulating layer and a sacrificial layer; a step of forming an etching mask on a surface of the workpiece; a step of forming a plurality of through via holes that reaches from a surface of the etching mask to the surface of the workpiece in a first area that is a part of the etching mask; and a step of forming a recess obtained by retracting a part of the surface of the etching mask toward the workpiece in a concave shape in a second area of the etching mask, which is adjacent to the first area.

Hereinafter, embodiments will be described with reference to the drawings. In order to facilitate understanding of the description, the same components are denoted by the same reference numerals as much as possible in each drawing, and redundant descriptions thereof will be omitted.

The semiconductor storage device 10 according to the embodiment is a non-volatile storage device configured as a NAND type flash memory. In the semiconductor storage device 10, a plurality of memory cells is arranged three-dimensionally. The configuration of the semiconductor storage device 10 will be described with reference to FIG. 1.

The semiconductor storage device 10 includes a semiconductor layer 20, a stacked portion 50, and a plurality of memory pillars 100.

The semiconductor layer 20 is a layer that functions as a so-called "source line" connected to the lower end of each of the memory pillars 100. The semiconductor layer 20 is, for example, a silicon substrate partially doped with impurities. The semiconductor layer 20 may be a layer made of amorphous silicon covering the silicon substrate from the surface. In this case, a peripheral circuit configured to implement reading and writing of data to and from the semiconductor storage device 10 may be formed between the silicon substrate and the semiconductor layer 20.

The stacked portion 50 is a coating film covering the semiconductor layer 20 from above. The term "above" as used herein refers to as an "upper side" when the semiconductor storage device 10 is viewed as illustrated in FIG. 1. Similarly, in the following description, terms such as "above" or "below" may be used. However, in each case, it is considered that the terms are used to indicate directions when the semiconductor storage device 10 is viewed as illustrated in FIG. 1.

In the stacked portion 50, a plurality of insulating layers 30 and conductor layers 40 are alternately stacked so as to be arranged along a direction perpendicular to the upper surface of the semiconductor layer 20. The insulating layer 30 is a layer configured to electrically insulate between the respective conductive layers 40. The insulating layer 30 is made of, for example, a material containing silicon oxide. As will be described later, the conductor layer 40 is a layer that is connected to the gate of each transistor formed along the memory pillar 100 to apply a voltage to the gate. The conductor layer 40 functions as a so-called "word line." The conductor layer 40 is made of, for example, a material containing tungsten.

The memory pillar 100 is a rod-shaped member formed in a substantially cylindrical shape (e.g., a shape of a circular cylinder having the same height and diameter). The memory pillar 100 is disposed such that the longitudinal direction thereof is along the stacked direction of the plurality of insulating layers 30 and conductor layers 40. The memory pillar 100 extends downward from the upper end of the stacked portion 50 to a position in the middle of the semiconductor layer 20. That is, the memory pillar 100 penetrates the entire stacked portion 50 including the insulating layers 30 and the conductor layers 40 in the vertical direction, and the lower end thereof is connected to the semiconductor layer 20 which is a base layer. A plurality of memory pillars 100 is provided in the semiconductor storage device 10.

Each memory pillar 100 is provided inside a memory hole MH formed in the stacked portion 50. The memory hole MH penetrates the entire insulating layers 30 and conductor layers 40 along the stacked direction, that is, along the vertical direction in FIG. 1.

Each memory pillar 100 includes a semiconductor layer 110 and a memory film 120. The semiconductor layer 110 is a portion that mainly constitutes the memory pillar 100, and is made of, for example, a material made of amorphous silicon. Another layer made of, for example, an insulating material may be formed inside the memory pillar 100.

The memory film 120 is a film that covers the entire side surface of the semiconductor layer 110. The memory film 120 is formed by stacking a plurality of films, but in FIG. 1, all of the films are illustrated as a single memory film 120. The plurality of films that constitute the memory film 120 include a tunnel insulating film, a charge storage film, and a block insulating film in this order from the inside. The block insulating film formed on the outermost side is connected with each of the stacked conductor layers 40.

The inside of the portion of the memory pillar 100 connected with each conductor layer 40 functions as a transistor. That is, in the semiconductor storage device 10, a plurality of transistors is connected in series along the longitudinal direction of each memory pillar 100. Each conductor layer 40 functions as the gate of each transistor. The semiconductor layer 110 positioned inside the transistor functions as a channel of the transistor.

Each transistor arranged in series as described above along the longitudinal direction of the memory pillar 100 functions as a memory cell configured to memory data. Further, the transistors formed on both end portions of a plurality of memory cells arranged in series function as a select transistor configured to control the current flowing through the channel of each memory cell.

Charges are stored in the charge storage film of the memory film 120 by applying a voltage to the conductor layer 40. The amount of the charge stored in the charge storage layer corresponds to the data stored in the memory cell. The memory cell may be a charge trap type using, for example, a silicon nitride film as the charge storage layer, or may be a floating gate type using, for example, a silicon film as the charge storage layer.

In the lower side end portion of the memory pillar 100, the memory film 120 is removed, and the lower end of the semiconductor layer 110 is connected to the semiconductor layer 20. Therefore, the semiconductor layer 20 that functions as a source line is electrically connected to each transistor channel. The upper end of the semiconductor layer 110 is connected to a bit line via a contact (not illustrated).

Various aspects that are already known may be adopted as the configuration of the peripheral circuit configured to implement reading and writing of data to each memory cell, or the specific operation. Therefore, a further specific description will be omitted.

Figure 2:
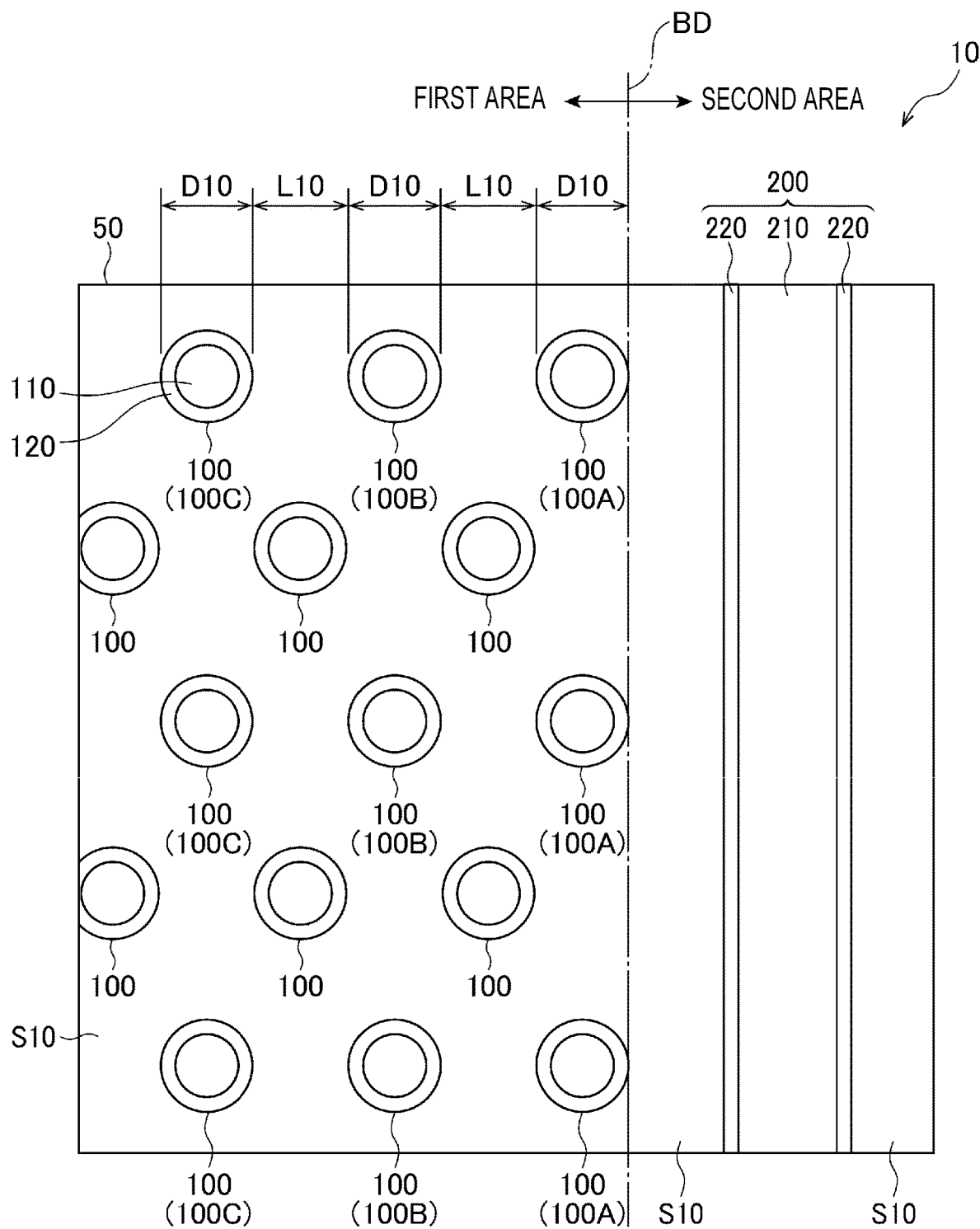
FIG. 2 is a top view illustrating the configuration of the semiconductor storage device illustrated in FIG. 1.

FIG. 2 illustrated the semiconductor storage device 10 illustrated in FIG. 1 as viewed from above. The uppermost side surface of the stacked layer 50 is also referred to as a "surface S10" in the following. FIG. 2 may be said to be a view of the stacked portion 50 of the semiconductor storage device 10 when viewed along a direction perpendicular to the surface S10. When viewed as described above, the stacked portion 50 includes a first area that is a portion in which a plurality of memory pillars 100 is provided, and a second area that is a portion adjacent to the first area, and is a portion in which the memory pillar 100 is not provided.

The alternate long and short dash line designated by the symbol "BD" in FIG. 2 indicates a boundary between the first area and the second area. The boundary is also referred to as a "boundary BD" in the following. For example, when viewed along the direction perpendicular to the surface S10 as illustrated in FIG. 2, the boundary BD is a straight line tangent to the outer periphery of a plurality of memory pillars 100, and may be defined as dividing the stacked portion 50 into a portion in which the plurality of memory pillars 100 are disposed and a portion in which the memory pillar 100 is not disposed.

FIG. 1 and FIG. 2 do not illustrate the entire semiconductor storage device 10, but illustrate a part of the semiconductor storage device 10. For example, at a position that is on the right side of the second area illustrated in FIG. 2, a first area similar to the one on the left side may be provided. Further, at a position that is on the left side of the first area illustrated in FIG. 2, a second area similar to the one on the right side may be provided.

In the second area, a separating portion 200 is provided. The separating portion 200 divides a plurality of memory pillars 100 or stacked portions 50 into groups referred to as "blocks", or groups referred to as "fingers." The separating portion 200 extends along the depth direction of the paper surface of FIG. 1. Similar to the memory pillar 100, the separating portion 200 penetrates the stacked portion 50.

The separating portion 200 is provided inside a slit ST formed in the stacked portion 50. Similar to the memory hole MH, the slit ST is formed to penetrate the entire insulating layers 30 and conductor layers 40 along the stacked direction.

The separating portion 200 includes a semiconductor 210 and an insulating film 220. The semiconductor 210 is a portion that mainly constitutes the separating portion 200, and is made of, for example, a material made of amorphous silicon. Another layer made of, for example, a conductive material may be formed inside the separating portion 200. The insulating film 220 is a film that covers the entire side surface of the semiconductor 210. The insulating film 220 is made of, for example, a material containing silicon oxide.

In the lower side end portion of the separating portion 200, the insulating film 220 is removed, and thus, the lower end of the semiconductor 210 is connected to the semiconductor layer 20. Therefore, the semiconductor layer 20 that functions as a source line is electrically connected to the semiconductor 210. The upper end of the semiconductor 210 is connected to a wiring layer (not illustrated) formed in an upper side portion of the semiconductor storage device 10 via a contact (not illustrated). As described above, in addition to the function of dividing the plurality of memory pillars 100 or stacked portions 50, the separating portion 200 has a function of electrically connecting the semiconductor layer 20 and the wiring layer with each other.

Hereinafter, a method for manufacturing the semiconductor storage device 10 according to the embodiment will be described.

[Stacking Step]

Figure 3:
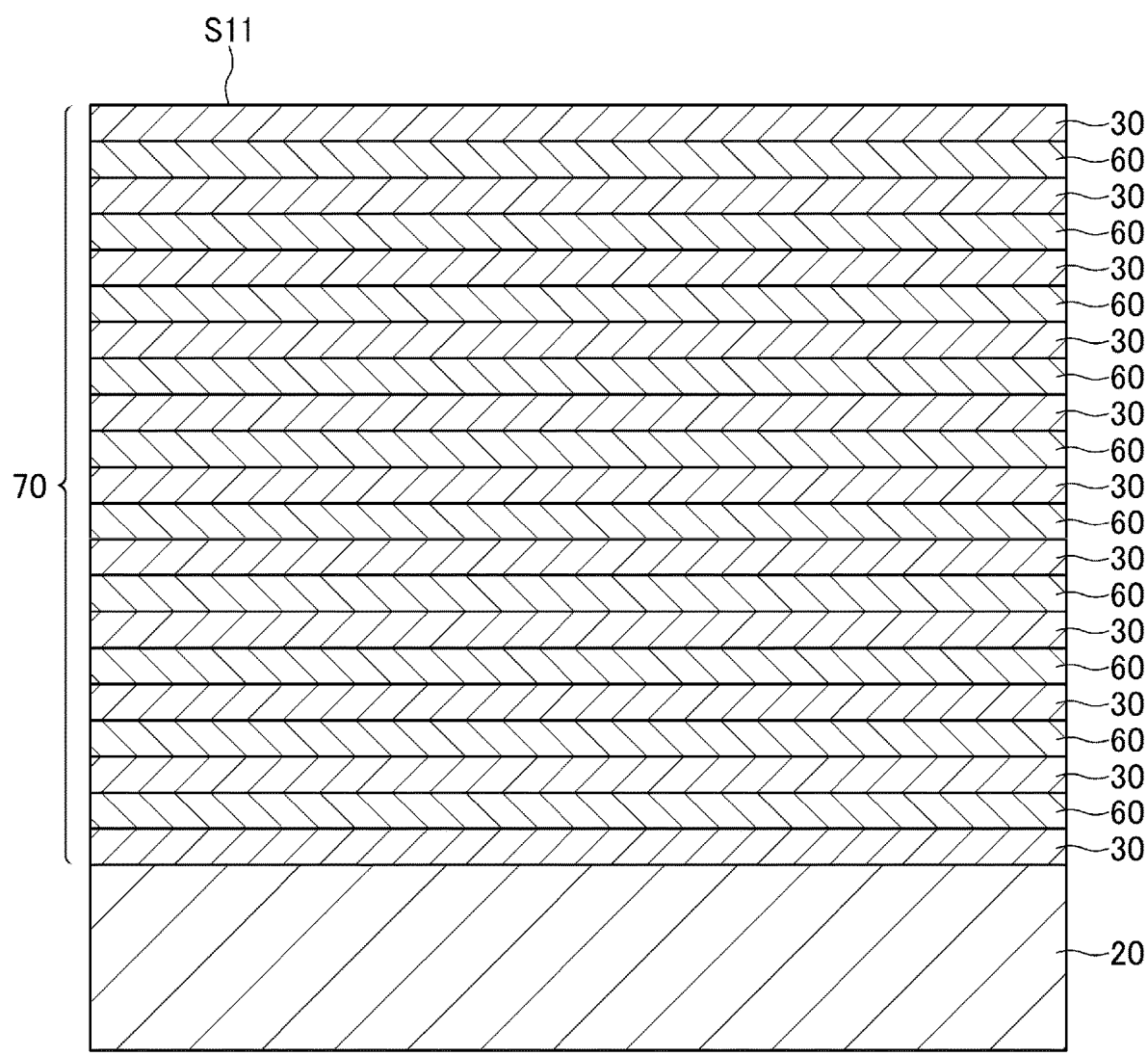
FIG. 3 is a cross-sectional view illustrating a method for manufacturing the semiconductor storage device illustrated in FIG. 1.

In a stacking step, a plurality of insulating layers 30 and sacrificial layers 60 are alternately formed to cover the upper surface of the semiconductor layer 20. FIG. 3 illustrates a state where the stacking step is completed. The entire stacked insulating layers 30 and sacrificial layers 60 are portions that are processed to form, for example, a memory hole MH, as will be described later. As a result, the entire insulating layers 30 and sacrificial layers 60 stacked in the stacking step are referred to as a "workpiece 70" in the following.

The workpiece 70 is a portion that eventually becomes the stacked portion 50 already described through a subsequent replacement step. The portion of the workpiece 70 that becomes the first area of the stacked portion 50 later is referred to as a "first area of the workpiece 70" in the following. Similarly, the portion of the workpiece 70 that becomes the second area of the stacked portion 50 later is referred to as a "second area of the workpiece 70" in the following. Further, similar to the case of the stacked portion 50, a boundary between the first area and the second area of the workpiece 70 is referred to as a "boundary BD" in the following.

The sacrificial layer 60 is a layer that is replaced with the conductor layer 40 in the subsequent replacement step, and is made of, for example, a material containing silicon nitride. In the stacking step, the workpiece 70 including the insulating layer 30 and the sacrificial layer 60 is formed by, for example, CVD. As described above, the stacking step is a step of forming the workpiece 70 by alternately stacking the insulating layer 30 and the sacrificial layer 60.

The surface of the workpiece 70 at the time when the stacking step is completed is referred to as a "surface S11" in the following. The surface S11 is a surface that eventually becomes the surface S10 of the stacked portion 50.

[Mask Forming Step]

Figure 4:
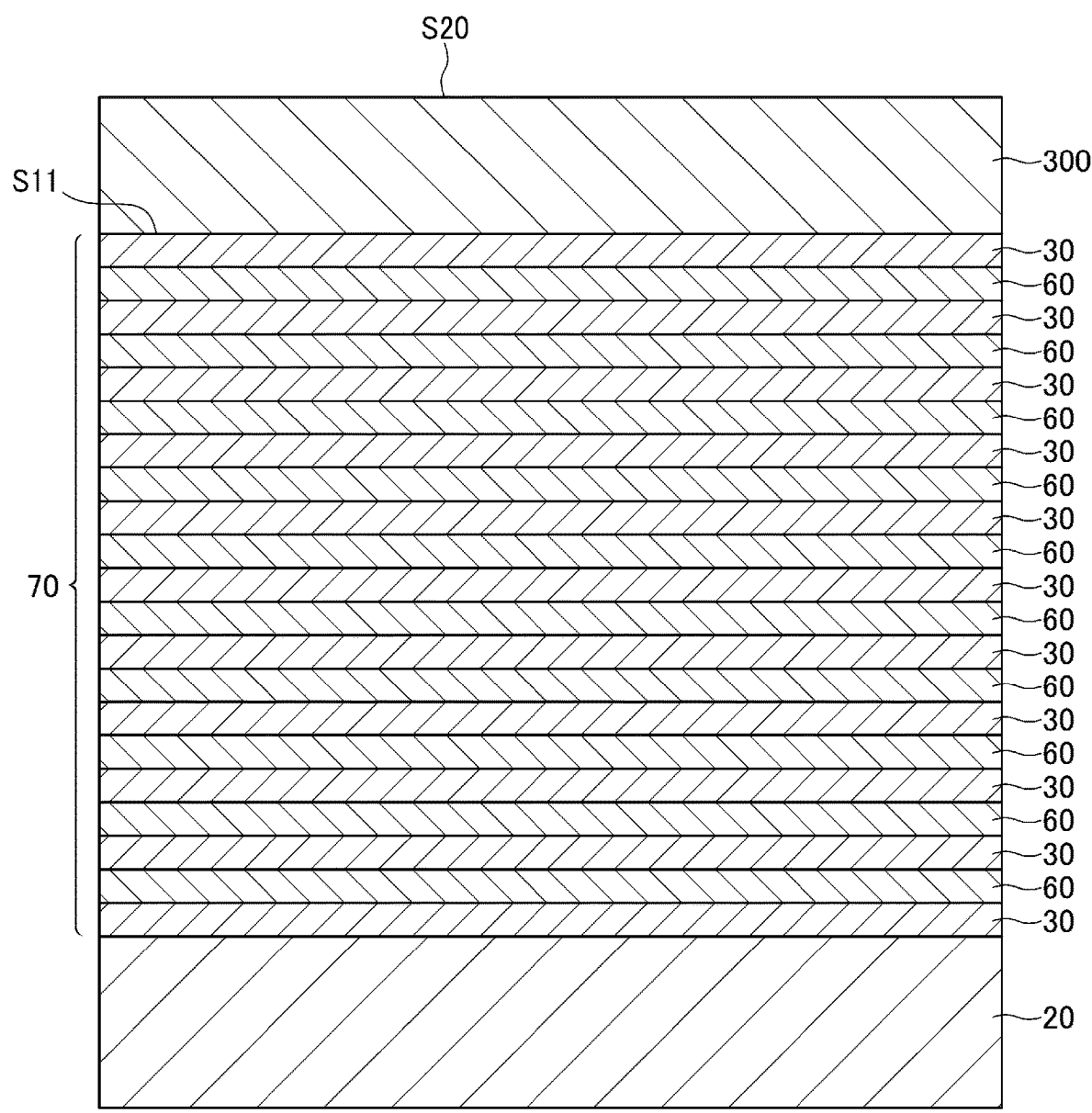
FIG. 4 is a cross-sectional view illustrating a method for manufacturing the semiconductor storage device illustrated in FIG. 1.

In a mask forming step performed after the stacking step, an etching mask 300 is formed to cover the surface S11 of the workpiece 70. FIG. 4 illustrates a state where the mask forming step is completed. As the etching mask 300, a carbon-based mask having a relatively high etching resistance may be used, and for example, APF may be used. As described above, the mask forming step is a step of forming the etching mask 300 on the surface S11 of the workpiece 70. The surface of the etching mask 300 at the time when the mask forming step is completed is referred to as a "surface S20" in the following.

[Mask Processing Step]

Figure 5:
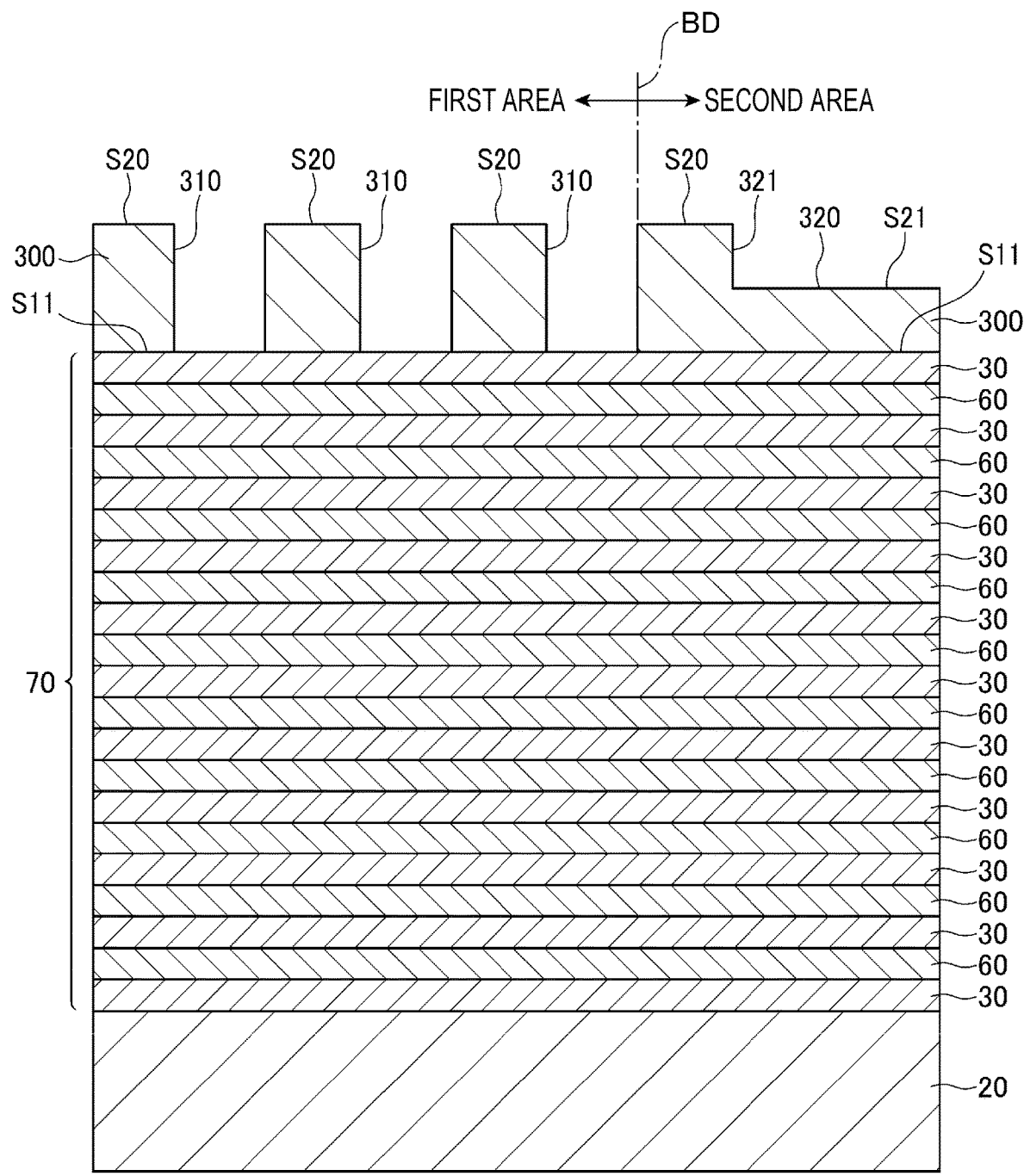
FIG. 5 is a cross-sectional view illustrating a method for manufacturing the semiconductor storage device illustrated in FIG. 1.

In a mask processing step performed after the mask forming step, through via holes 310 and a recess 320 are formed on the etching mask 300. FIG. 5 illustrates a state where the mask processing step is completed. The through via holes 310 are holes formed to penetrate the etching mask 300 at each position where the memory hole MH is formed. Each through via hole 310 is formed to reach the surface S11 of the workpiece 70 from the surface S20 of the etching mask 300. The shape of the through via hole 310 when viewed along a direction perpendicular to the surface S20 is substantially the same as the shape of the memory hole MH formed later.

Also with respect to the etching mask 300, similar to the case of the stacked portion 50 or the workpiece 70, a "first area" and a "second area" are defined. That is, the "first area" of the etching mask 300 is a portion of the etching mask 300 where the through via holes 310 are formed, which covers the first area of the workpiece 70 from above. The "second area" of the etching mask 300 is a portion of the etching mask 300 where the through via hole 310 is not formed, which covers the second area of the workpiece 70 from above.

Similar to the case of the stacked portion 50, a boundary between the first area and the second area of the etching mask 300 is also referred to as a "boundary BD" in the following. When viewed along the direction perpendicular to the surface S20, the boundary BD in the etching mask 300 is in a state of overlapping with the boundary BD in the workpiece 70.

The boundary BD in the etching mask 300 may be defined in the same manner as the boundary BD in the stacked portion 50 as described with reference to FIG. 2. That is, when viewed along the direction perpendicular to the surface S20, the boundary BD in the etching mask 300 is a straight line tangent to the edge of a plurality of through via holes 310, and may be defined as dividing the etching mask 300 into a portion in which the plurality of through via holes 310 are formed and a portion in which the through via hole 310 is not formed.

In the mask processing step, in addition to forming the plurality of through via holes 310 in the first area of the etching mask 300 as described above, the recess 320 is formed in the second area of the etching mask 300. As illustrated in FIG. 5, the recess 320 is obtained by retracting or lowering a part of the surface S20 of the etching mask 300 toward the workpiece 70 in a concave shape or in a step shape. The surface of the etching mask 300 in the retracted portion in a concave shape may be referred to as a "surface S21" in the following to distinguish from the surface S20. Effect of forming the recess 320 and a specific forming method will be described later.

As described above, the mask processing step is a step of forming the plurality of through via holes 310 that reach the surface S11 of the workpiece 70 from the surface S20 of the etching mask 300 in the first area that is a part of the etching mask 300, and further, forming the recess 320 obtained by retracting apart of the surface S20 of the etching mask 300 toward the workpiece 70 in a concave shape in the second area of the etching mask 300, which is adjacent to the first area.

[Recess Forming Step]

Figure 6:
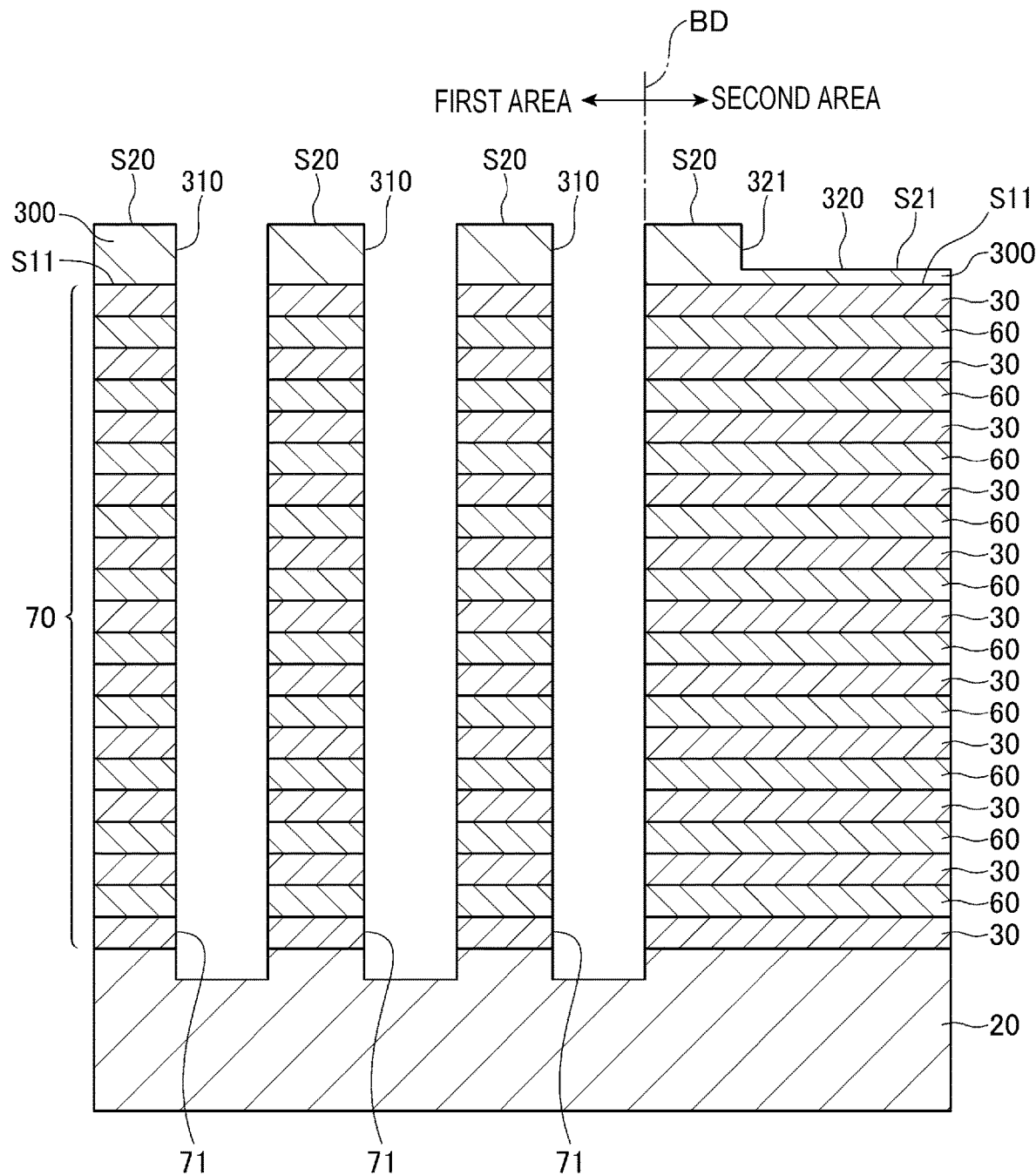
FIG. 6 is a cross-sectional view illustrating a method for manufacturing the semiconductor storage device illustrated in FIG. 1.

In a recess forming step performed after the mask processing step, recesses 71 that become the memory holes MH later are formed by, for example, reactive ion etching (RIE). FIG. 6 illustrates a state where the recess forming step is completed. In the recess forming step, ions reach a position in the workpiece 70, which is immediately below the through via hole 310 to etch the workpiece 70, and thus, the recess 71 is formed.

The recess 71 is formed from the surface S11 of the workpiece 70 to a position in the middle of the semiconductor layer 20. As described above, the recess forming step is a step of forming the recess 71 that penetrates the workpiece 70 and reaches the middle of the semiconductor layer 20 below the workpiece 70. In the recess forming step, the semiconductor layer 20 functions as an etching stopper when forming the recess 71.

In the recess forming step, the etching mask 300 is also slightly etched. As a result, the thickness of each part of the etching mask 300 at the time when the recess forming step is completed is thinner than the initial thickness at the time when the mask processing step is completed. However, the second area of the etching mask 300 including the recess 320 still covers the entire second area of the workpiece 70 at the time when the recess forming step is completed. As a result, in the recess forming step, the surface S11 in the second area of the workpiece 70 is not etched. When the recess forming step is completed, the etching mask 300 is removed by asking.

[Memory Pillar Forming Step]

Figure 7:
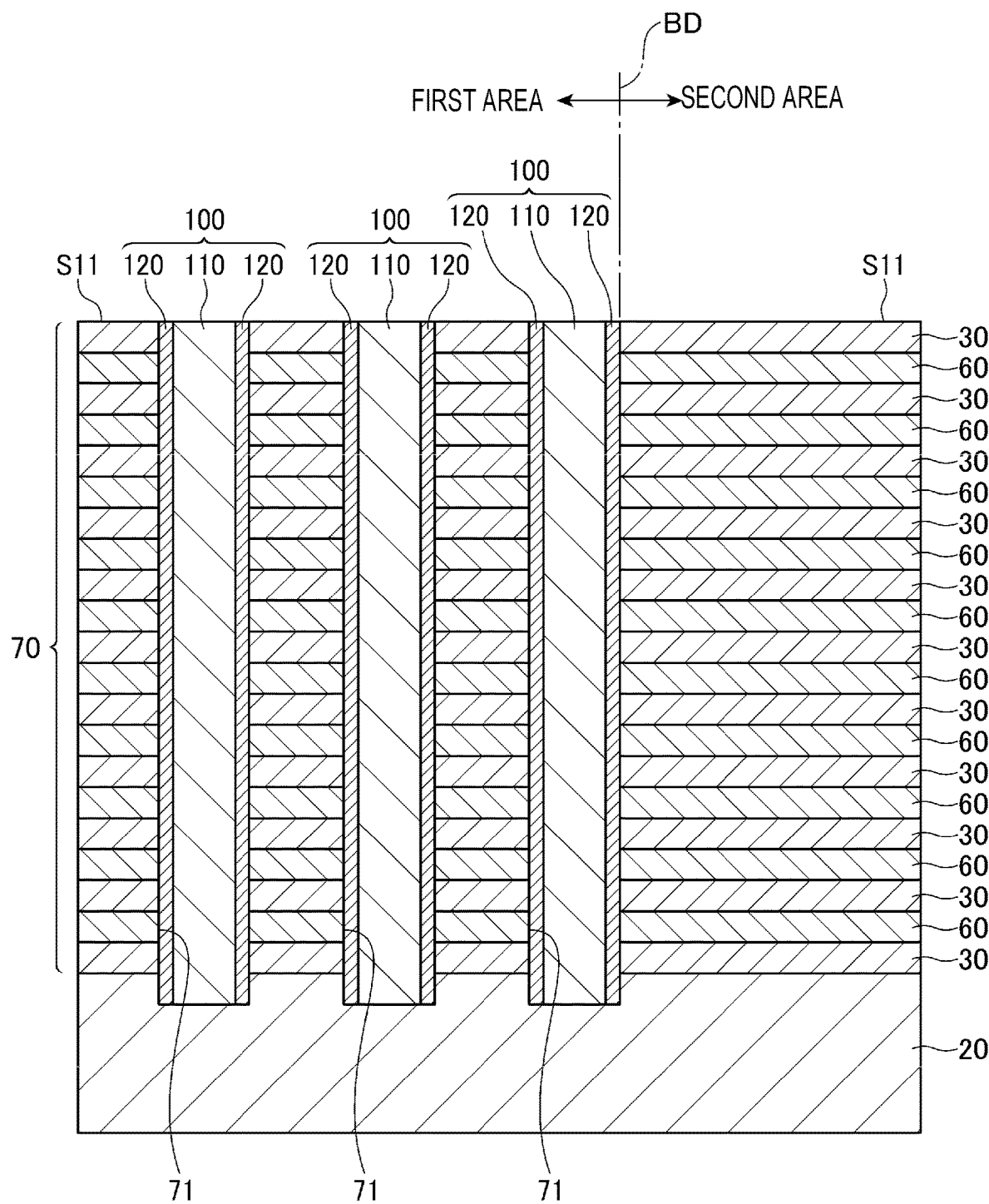
FIG. 7 is a cross-sectional view illustrating a method for manufacturing the semiconductor storage device illustrated in FIG. 1.

In a memory pillar forming step performed after the recess forming step, a block insulating film, a charge storage film, and a tunnel insulating film are formed on the inner peripheral surface of the recess 71 in this order, and thus, the memory film 120 is formed. Thereafter, the semiconductor layer 110 is formed further inside the memory film 120, and thus, the memory pillar is formed. FIG. 7 illustrates a state where the memory pillar forming step is completed. Both the memory film 120 and the semiconductor layer 110 are formed by, for example, CVD.

[Slit Forming Step]

Figure 8:
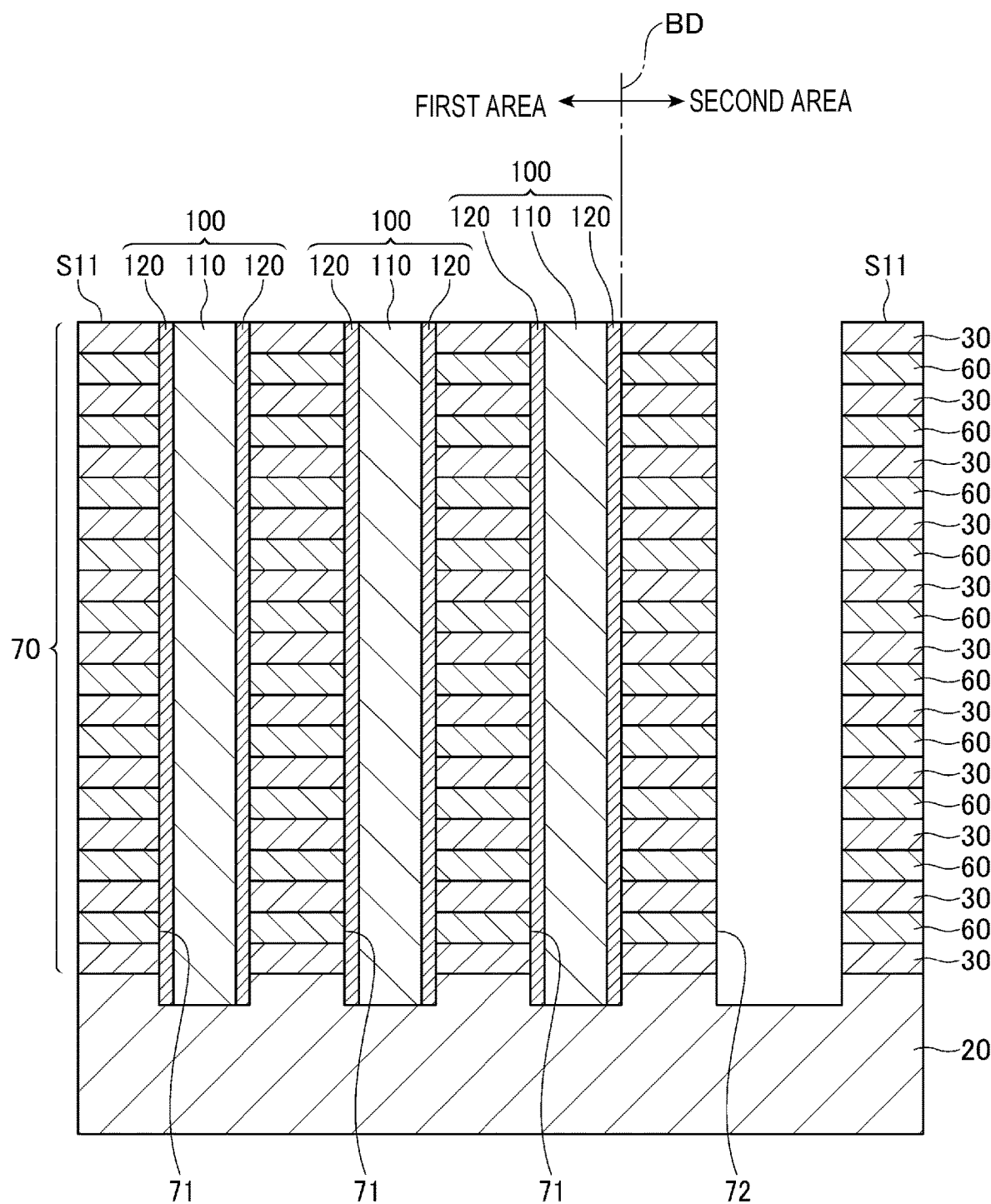
FIG. 8 is a cross-sectional view illustrating a method for manufacturing the semiconductor storage device illustrated in FIG. 1.

In a slit forming step performed after the memory pillar forming step, a slit-shaped recess 72 that becomes a slit ST later is formed in the second area of the workpiece 70 by, for example, RIE. FIG. 8 illustrates a state where the slit forming step is completed. The shape of the recess 72 is similar to the shape of the slit ST described with reference to FIG. 1.

Although not illustrated, also in the slit forming step, the etching mask is formed in advance on the surface S11 of the workpiece 70 similar to the case of the recess forming step, and a part of the workpiece 70 is etched through the opening of the etching mask. The recess 72 is formed from the surface S11 of the workpiece 70 to a position in the middle of the semiconductor layer 20.

[Replacement Step]

Figure 9:
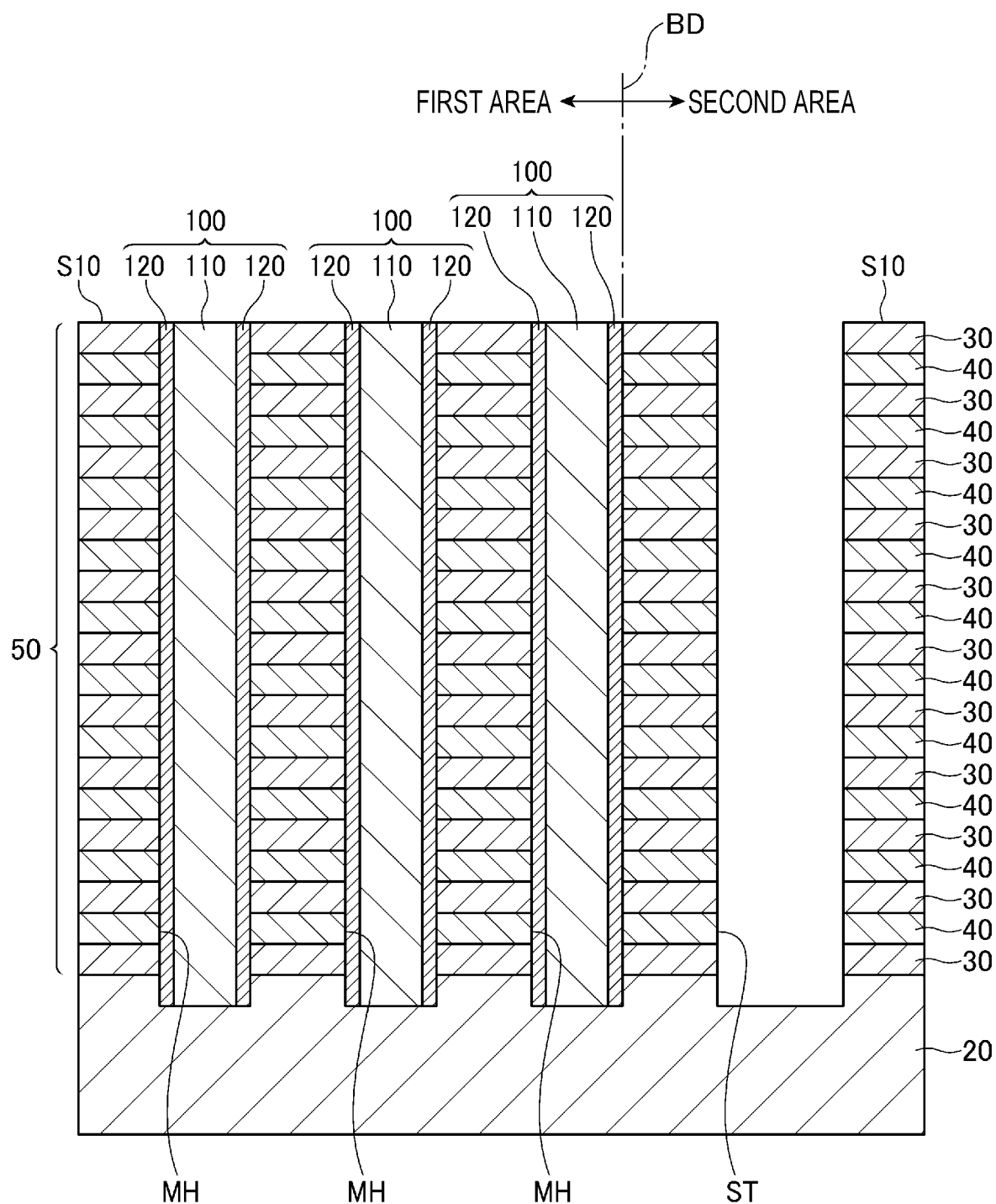
FIG. 9 is a cross-sectional view illustrating a method for manufacturing the semiconductor storage device illustrated in FIG. 1.

In a replacement step performed after the slit forming step, the plurality of sacrificial layers 60 formed in the workpiece 70 are replaced with the conductor layers 40. FIG. 9 illustrates a state where the replacement step is completed. In the replacement step, all the sacrificial layers 60 are removed by wet etching through the recess 72. Thereafter, for example, a metal material containing tungsten is embedded in the space where the sacrificial layers 60 are formed, and thus, the conductor layers 40 are formed. The metal material is embedded by, for example, CVD. The workpiece 70 becomes the stacked portion 50 by substituting the sacrificial layers 60 with the conductor layers 40. Further, the recesses 71 formed in the workpiece 70 become the memory holes MH in the stacked portion 50, and the recess 72 formed in the workpiece 70 becomes the slit ST in the stacked portion 50.

[Separating Portion Forming Step]

In a separating portion forming step performed after the replacement step, the insulating film 220 is formed on the inner peripheral surface of the slit ST. Thereafter, the semiconductor 210 is formed further inside the insulating film 220, and thus, the separating portion 200 is formed. Therefore, the semiconductor storage device 10 illustrated in FIG. 1 is completed. Both the insulating film 220 and the semiconductor 210 are formed by, for example, CVD.

Figure 10:
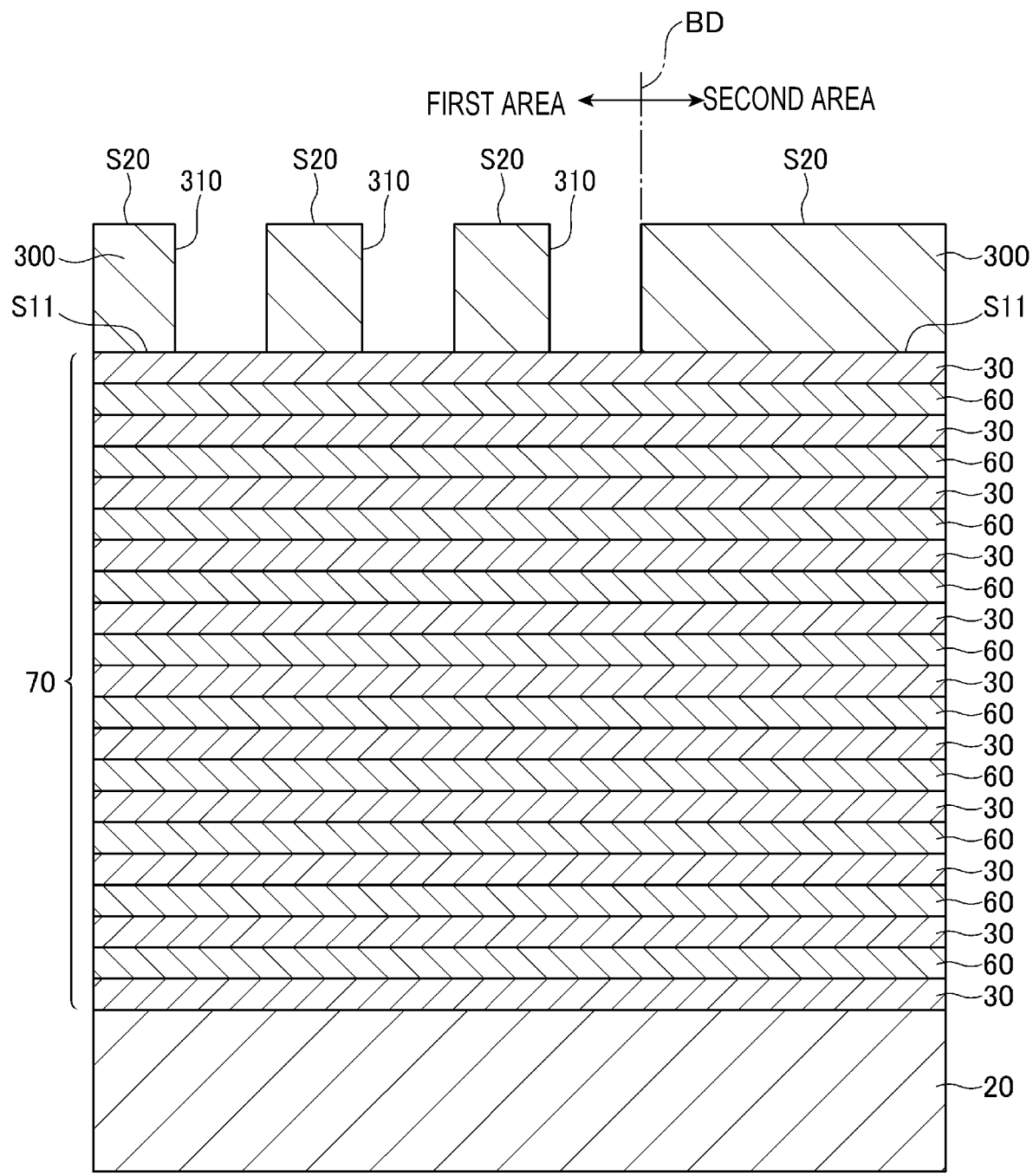
FIG. 10 is a view illustrating a problem in a manufacturing method in the related art.

The reason why the recess 320 is formed in the second area of the etching mask 300 in the mask processing step will be described. First, an example in which the recess 320 is not formed in the mask processing step as in the manufacturing method in the related art will be described as a comparative example of the present disclosure. FIG. 10 illustrates a state where the mask processing step is completed in the manufacturing method according to the comparative example. At the time when the mask processing step according to the comparative example is completed, similar to the example in FIG. 5, a plurality of through via holes 310 is formed in the first area of the etching mask 300. Meanwhile, unlike the example in FIG. 5, the recess 320 is not formed in the second area of the etching mask 300.

Figure 11:
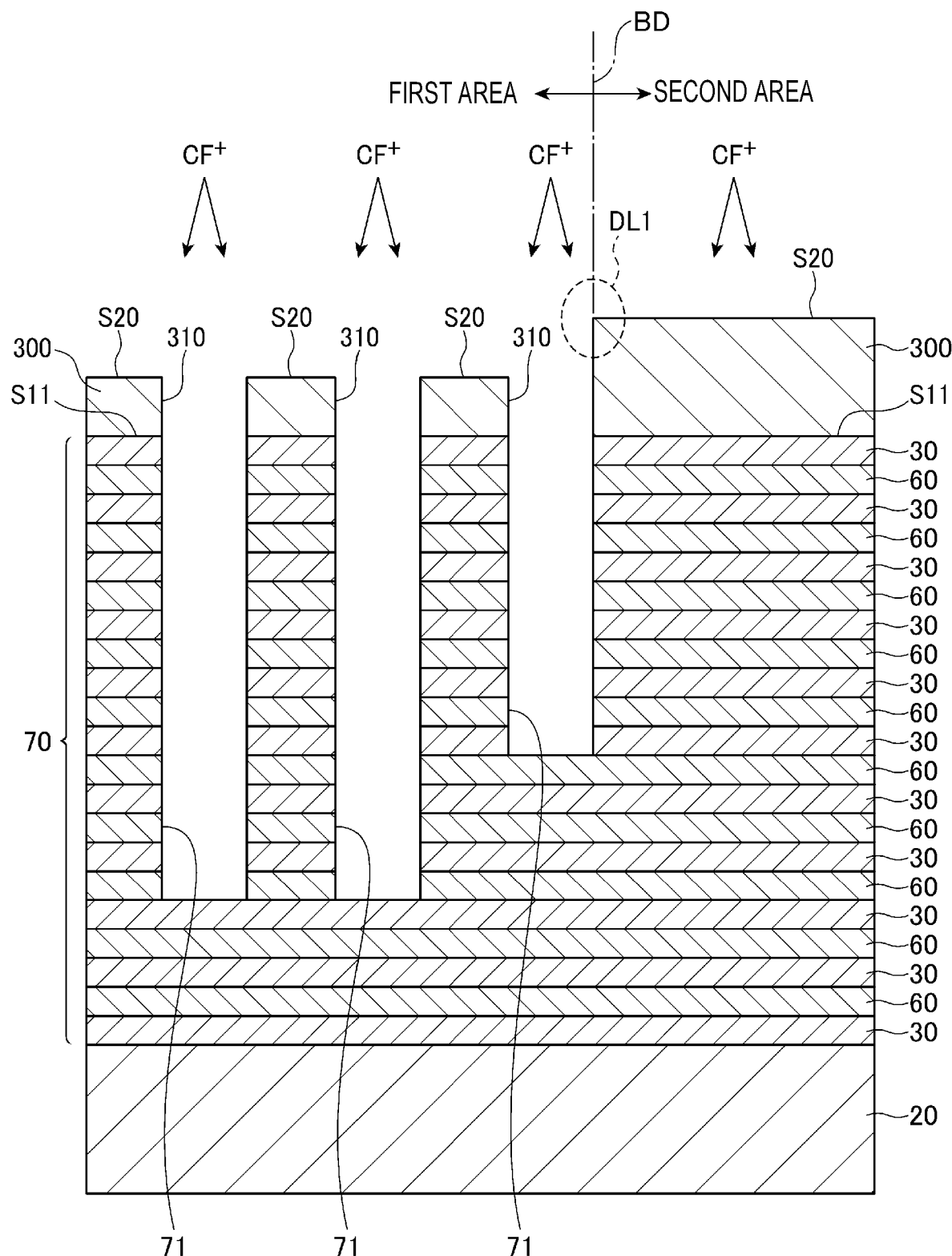
FIG. 11 is a view illustrating a problem in a manufacturing method in the related art.

Even after the etching mask 300 is processed as illustrated in FIG. 10, it may be thought that the recess 71 as in FIG. 6 may be formed by performing the subsequent recess forming step. However, in this case, it is difficult to evenly form each of the recesses 71. FIG. 11 schematically illustrates a state where the recess processing step is being performed following the state in FIG. 10. As illustrated in FIG. 11, in the comparative example, the etching rate of the recess 71 formed at the position closest to the boundary BD becomes lower than the etching rate of the recess 71 formed at other positions.

The reason is as follows. As is generally known, when anisotropic etching is performed by, for example, RIE, the consumption rate of the etching mask 300 is changed from place to place depending on the density of the processing pattern, due to the so-called "loading effect." In the comparative example, the consumption rate of the etching mask 300 is relatively high in the first area where the plurality of through via holes 310 are densely formed, while the consumption rate of the etching mask 300 is relatively low in the second area where the through via hole 310 is not formed.

As a result, as in the portion surrounded by the dotted line DL1 in FIG. 11, a step is formed on the surface S20 of the etching mask 300 at the boundary BD and the portion in the vicinity. Specifically, the height position of the surface S20 in the second area becomes higher than the height position of the surface S20 in the first area.

In RIE, not all the fluorocarbon ions (CF+) that reach the workpiece 70 through the through via hole 310 proceed along the direction perpendicular to the surface S20, but a part thereof proceeds along a direction inclined with respect to the same direction. That is, there is a predetermined angular distribution with respect to the direction in which the fluorocarbon ions travel.

As a result, for example, a part of the fluorocarbon ions toward the surface S20 in the space on the second area side from the boundary BD is blocked by the stepped portion of the etching mask 300 surrounded by the dotted line DL1 due to the so-called "shadowing effect", and thus, it is not possible to reach the workpiece 70. As a result, the etching rate of the recess 71 formed at the position closest to the boundary BD becomes lower than the etching rate of the recess 71 formed at other positions.

Further, in the second area, accompanying by etching of the etching mask 300 in a wide range, the components separated from the etching mask 300 are temporarily suspended. A part of the components enter the inside of the through via holes 310 in the vicinity of the boundary BD, and hinders the etching of the workpiece 70 by the fluorocarbon ions. Due to the phenomenon, it may be thought that the etching rate of the recess 71 formed at the position closest to the boundary BD is decreased.

In order to process all the recesses 71 so as to reach the semiconductor layer 20 from the state in FIG. 11, it is necessary to excessively perform RIE in the recess forming step. However, when all the recesses 71 are to be formed by excessively performing RIE, the inner diameter of each recess 71 may become too large at least a part thereof. In recent years, there is a tendency to increase the number of the stacked layers in the workpiece 70 for high integration. However, as the number of the stacked layers in the workpiece 70 increases, the above problems become apparent, and thus, it is difficult to form the recess 71 by excessive RIE.

Figure 12:
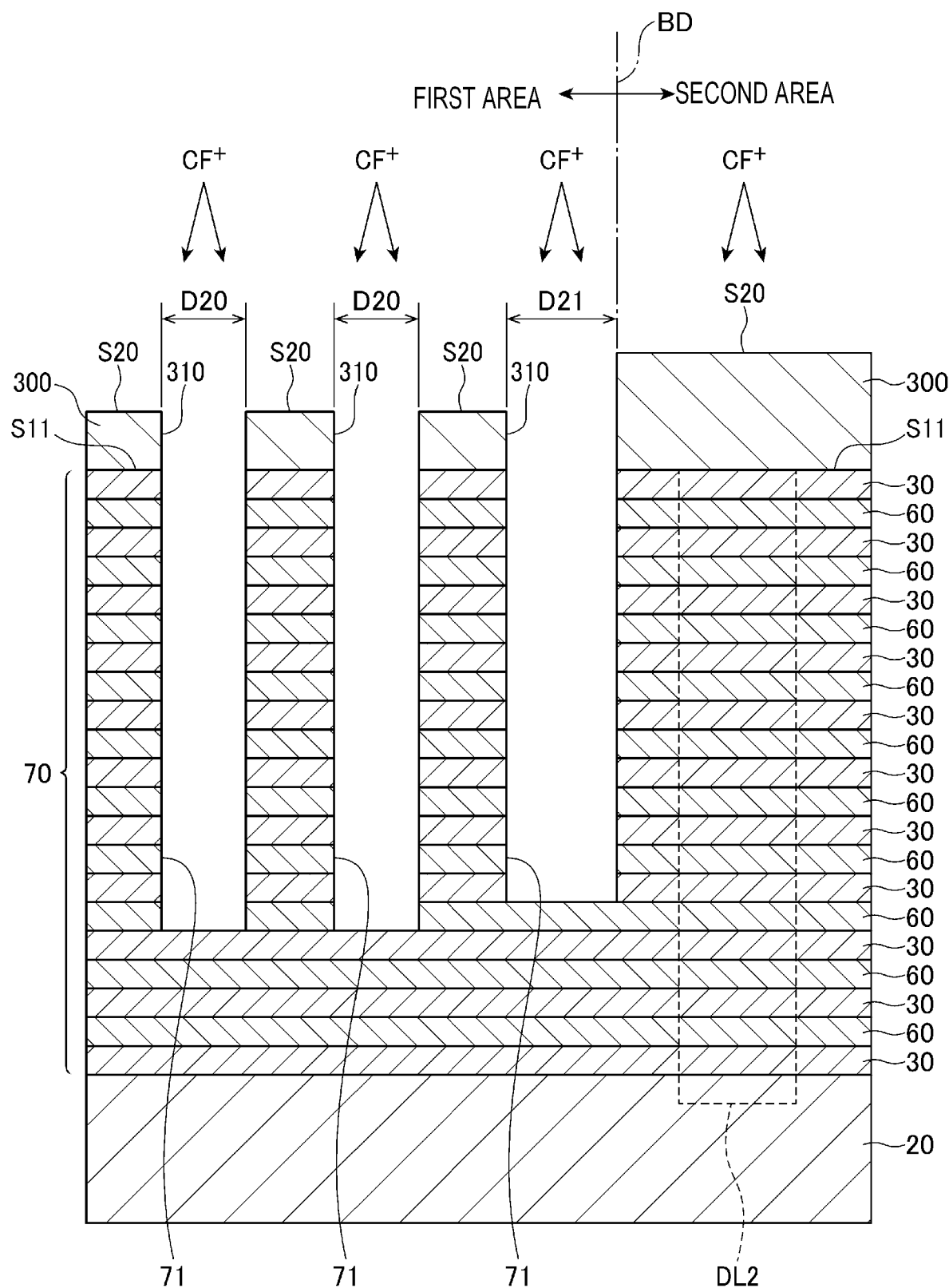
FIG. 12 is a view illustrating a problem in a manufacturing method in the related art.

As a measure to prevent the phenomenon that the etching rate of the recess 71 formed at the position closest to the boundary BD decreases, for example, as in the example illustrated in FIG. 12, it may be conceivable that the inner diameter D21 of the recess 71 formed at the position closest to the boundary BD is made larger than the inner diameter D20 of the other recess 71. Specifically, in the mask processing step, it may be conceivable that, for example, by performing OPC correction, the inner diameter D21 of the through via hole 310 formed at the position closest to the boundary BD is formed to be larger than the inner diameter D20 of the other through via hole 310, and then, the subsequent recess forming step is performed.

In this case, since the etching rate of the recess 71 formed at the position closest to the boundary BD is higher than the case in FIG. 11, the etching rate of each recess 71 may be substantially uniform even under the situation where the above-described loading effect occurs. However, when considering that recent semiconductor storage devices are required to be miniaturized and highly integrated at a high level, it is not desirable to increase the shape of some recesses 71.

For example, in FIG. 12, the shape of the recess 72 formed in the subsequent slit forming step is illustrated by the dotted line DL2. When the inner diameter of the recess 71 formed at the position closest to the boundary BD is made to be large, the recess 71 is too close to the dotted line DL2 (i.e., recess 72). Further, as the number of the stacked layers in the workpiece 70 increases, it becomes difficult to entirely make the inner diameter of the recess 71 uniform in the vertical direction, and thus, it is difficult to reduce the distance between the recess 71 and the dotted line DL2.

In a method for manufacturing a semiconductor storage device in the related art, for example, as in the example illustrated in FIG. 12, the problem of unevenness of the etching rate in the recess forming step is solved by making the shape of the through via hole 310 formed in the vicinity of the boundary BD different from the shape of the other through via holes. However, as a semiconductor storage device becomes further smaller and more integrated in the future, there are limits to the solutions described above. In order to cope with, for example, high integration, it is desirable to reduce the influence of the loading effect at the time of manufacturing, and to make the shape of all the recesses 71 uniform.

Therefore, in the embodiment, as already described, the recess 320 is formed in the etching mask 300 in the mask processing step.

Figure 13:
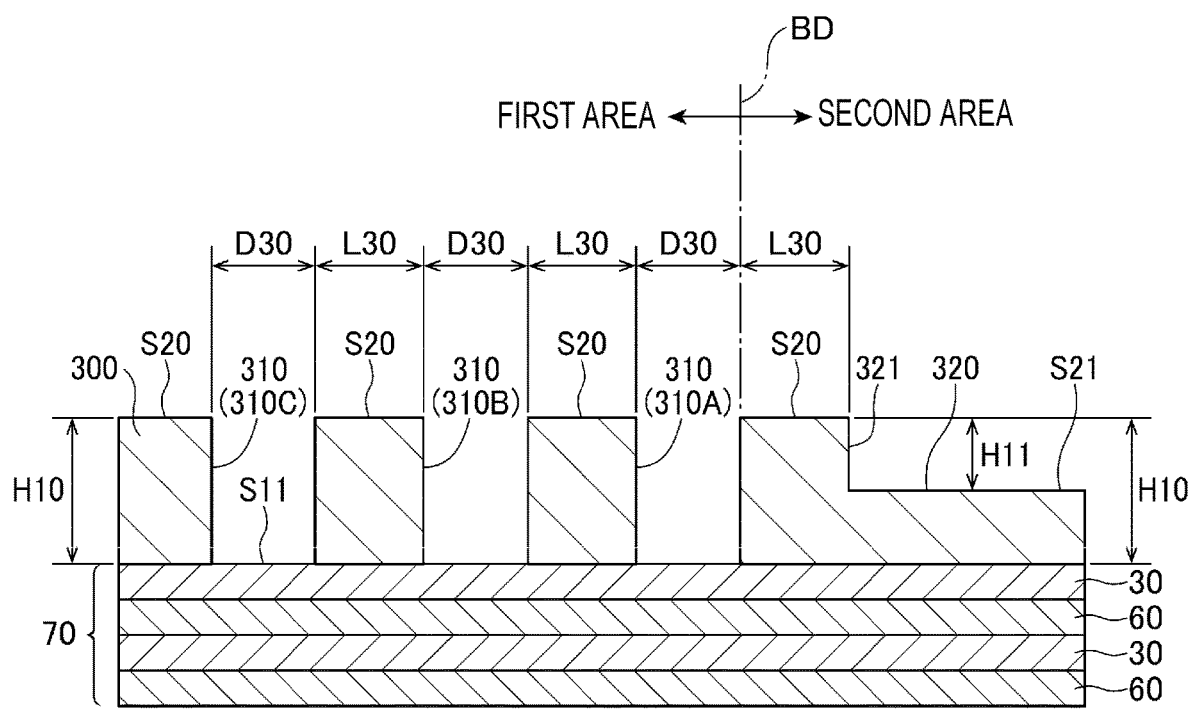
FIG. 13 is a cross-sectional view illustrating a method for manufacturing the semiconductor storage device illustrated in FIG. 1.

FIG. 13 illustrates a state where the mask processing step of the embodiment is completed in the same manner as in FIG. 5. FIG. 13 illustrates a part of the upper side of the workpiece 70. The same applies to FIG. 15 to FIG. 23, which will be used for description later.

Figure 14:
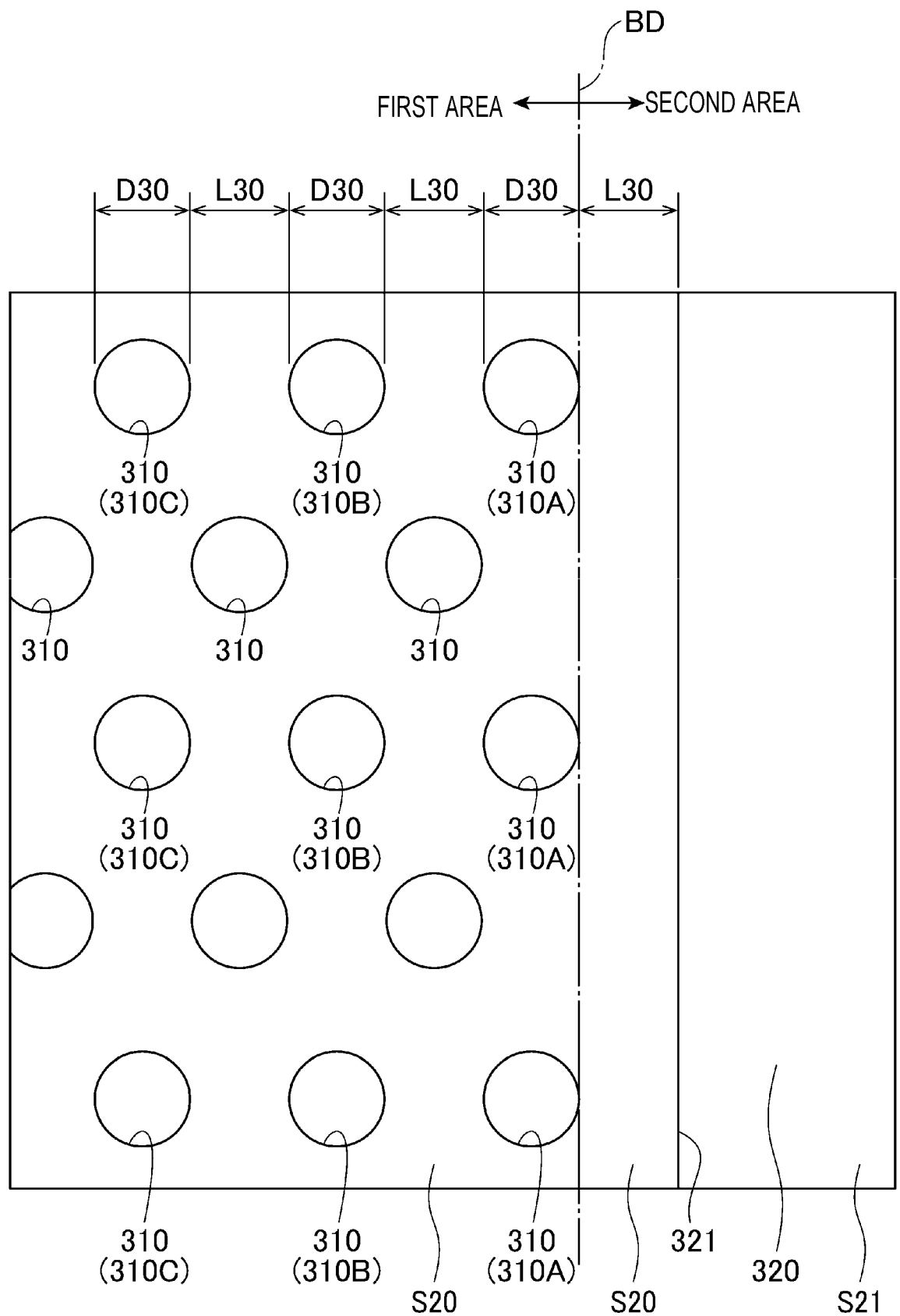
FIG. 14 is a top view illustrating a method for manufacturing the semiconductor storage device illustrated in FIG. 1.

FIG. 14 illustrates the etching mask 300 illustrated in FIG. 13 when viewed along the direction perpendicular to the surface S20. As illustrated in FIG. 14, when viewed along the direction perpendicular to the surface S20 of the etching mask 300, the recess 320 is formed such that a first area side end portion 321 of the recess 320 is in parallel with the boundary BD between the first area and the second area. As illustrated in FIG. 13, the term "the first area side end portion 321 of the recess 320" refers to a wall surface extending toward upward from the first area side end portion of the surface S21.

In FIG. 13, the height of the wall surface of the etching mask 300, that is, the depth of the recess 320 is referred to as "H11." Assuming that the thickness of the portion of the etching mask 300 excluding the recess 320 is "H10", the thickness of the recess 320 portion of the etching mask 300 is (H10−H11).

As illustrated in FIG. 14, when viewed along the direction perpendicular to the surface S20 of the etching mask 300, the through via hole 310 formed at the position closest to the boundary BD between the first area and the second area of the etching mask 300 is also referred to as a "first through via hole 310A" in the following. Further, the through via hole 310 formed at the position adjacent to the first through via hole 310A along the direction (i.e., left-right direction in FIG. 14) perpendicular to the boundary BD is also referred to as a "second through via hole 310B" in the following. Further, the through via hole 310 formed at the position adjacent to the second through via hole 310B along the same direction, and formed at the position on the side opposite to the first through via hole 310A is also referred to as a "third through via hole 310C" in the following.

In the mask processing step of the embodiment, each of the through via holes 310 is formed such that the shortest distance from the edge of the first through via hole 310A to the edge of the second through via hole 310B and the shortest distance from the edge of the second through via hole 310B to the edge of the third through via hole 310C are equal to each other. In FIG. 13 and FIG. 14, the shortest distance is referred to as "L30." In the mask processing step of the embodiment, each of the through via holes 310 is formed such that, not only the first through via hole 310A, the second through via hole 310B, and the third through via hole 310C described above, but also all the distances between the through via holes 310 adjacent to each other along the direction perpendicular to the boundary BD are equal to L30.

Further, in the mask processing step of the embodiment, each of the through via holes 310 and the recess 320 are formed such that the shortest distance from the edge of the first through via hole 310A to the edge of the second through via hole 310B and the shortest distance from the edge of the first through via hole 310A to the recess 320 are equal to each other. That is, in the mask processing step of the embodiment, the recess 320 is formed such that the shortest distance from the edge of the first through via hole 310A to the recess 320 is L30.

Further, in the mask processing step of the embodiment, when viewed along the direction perpendicular to the surface S20 of the etching mask 300, each of the through via holes 310 is formed such that the first through via hole 310A and the second through via hole 310B have the same shape as each other. In FIG. and FIG. 14, the inner diameter of each through via hole 310 is referred to as "D30." In the mask processing step of the embodiment, each of the through via holes 310 is formed such that, not only the first through via hole 310A and the second through via hole 310B described above, but also all the through via holes 310 have the inner diameter equal to D30.

The inner diameter of the first through via hole 310A and the inner diameter of the second through via hole 310B do not have to be completely the same as each other. At least the width of the first through via hole 310A and the width of the second through via hole 310B may be the same as each other at the same height position. The term "width" in the above refers to, for example, the inner diameter dimension of the first through via hole 310A or the second through via hole 310B along the direction (left-right direction in FIG. 13) perpendicular to the boundary BD.

In FIG. 13, when focusing on the first through via hole 310A formed at the position closest to the boundary BD, the etching mask 300 having a width of L30 and a height of H10 exists on the left side of the first through via hole 310A.

Further, the etching mask 300 having a width of L30 and a height of H10 exists on the right side of the first through via hole 310A.

Next, when focusing on the second through via hole 310B near to the first through via hole 310A in the same drawing, the etching mask 300 having a width of L30 and a height of H10 exists on the left side of the second through via hole 310B. Further, the etching mask 300 having a width of L30 and a height of H10 exists on the right side of the second through via hole 310B.

That is, when the shape of the etching mask 300 that exists around the first through via hole 310A and the shape of the etching mask 300 that exists around the second through via hole 310B are compared with each other, they are in agreement with each other. The first through via hole 310A and the second through via hole 310B are in agreement with each other in the shape of the etching mask 300 disposed around each of them, and thus, are also in agreement with each other in case of occurrence of the loading effect.

Therefore, in the mask processing step, when the etching mask 300 is processed to have the shape described above, the influence of the loading effect is reduced in the subsequent recess forming step. That is, the consumption rate of the etching mask 300 becomes uniform through the entire area including the portion between the first through via hole 310A and the recess 320. As a result, the step similar to the portion surrounded by the dotted line DL1 in FIG. 11 is not generated, and thus, it is possible to uniformly process all the recesses 71 substantially at the same etching rate. Assuming that the inner diameters of all the through via holes 310 formed in the etching mask 300 are uniformly set to D30 as in the embodiment, the inner diameter of the recess 71 formed in the recess forming step may have the same dimension for all the recesses 71.

In the recess forming step, since the surface S21 of the recess 320 is also etched, so that the components separated from the surface S21 are temporarily suspended, which may affect to the etching of the workpiece 70 under the first through via hole 310A. However, the components separated from the surface S21 are blocked by the first area side end portion 321 of the recess 320, and thus, it is possible to reduce the influence of the components to a negligible extent. According to an experiment executed by the present inventors, assuming that H11, which is the depth of the recess 320, is approximately 500 nm, it is confirmed that the etching rate of the recess 71 may be equalized. The dimension may be adjusted to an appropriate dimension according to, for example, the number of stacked layers of the insulating layer 30 and the sacrificial layer 60 in the workpiece 70, the material of the etching mask 300, and the etching conditions.

In the following, details of the mask processing step so as to process the etching mask 300 into the shape illustrated in FIG. 13 and FIG. 14 will be described. The following description is merely an example of the mask processing step. In the mask processing step, the etching mask 300 may be processed by a method different from the method described below.

[Anti-Reflecting Film Forming Step]

The mask forming step is performed to form the etching mask 300 having a uniform thickness as illustrated in FIG. 4, and then, an antireflection film forming step is performed. In the antireflection film forming step, an antireflection film 410 is formed to cover the surface S20 of the etching mask 300. The antireflection film 410 is an antireflection film made of, for example, a material containing silicon oxide.

Figure 15:
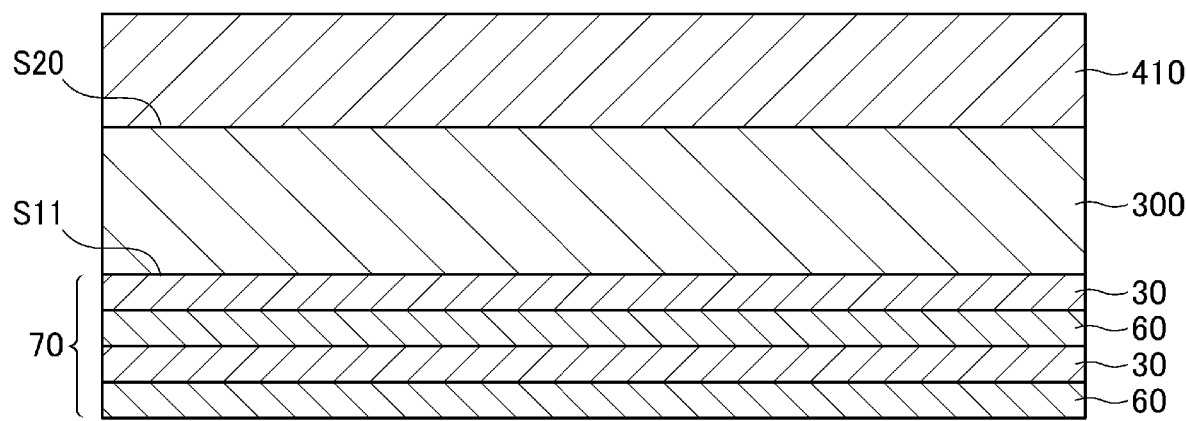
FIG. 15 is a cross-sectional view illustrating a method for manufacturing the semiconductor storage device illustrated in FIG. 1.

The antireflection film 410 is formed by, for example, CVD. FIG. 15 illustrates a state where the antireflection film forming step is completed.

[First Resist Forming Step]

Figure 16:
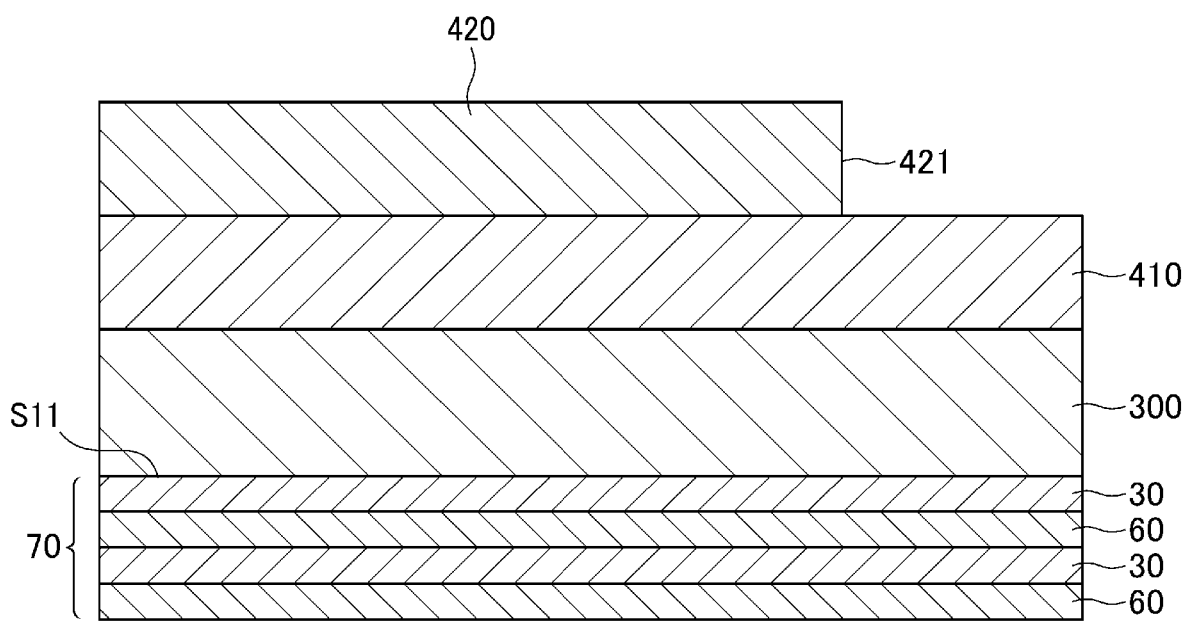
FIG. 16 is a cross-sectional view illustrating a method for manufacturing the semiconductor storage device illustrated in FIG. 1.

In a first resist forming step performed after the antireflection film forming step, a resist film 420 is formed to cover the surface of the antireflection film 410. Thereafter, a portion of the resist film 420 corresponding to the recess 320 is removed by exposing and etching the resist film 420. FIG. 16 illustrates a state where the first resist forming step is completed.

An opening formed in the resist film 420 by the above etching is also referred to as an "opening 421." A portion of the etching mask 300 immediately below the opening 421 is processed in the subsequent mask processing step and becomes the recess 320.

[Mask Recess Forming Step]

Figure 17:
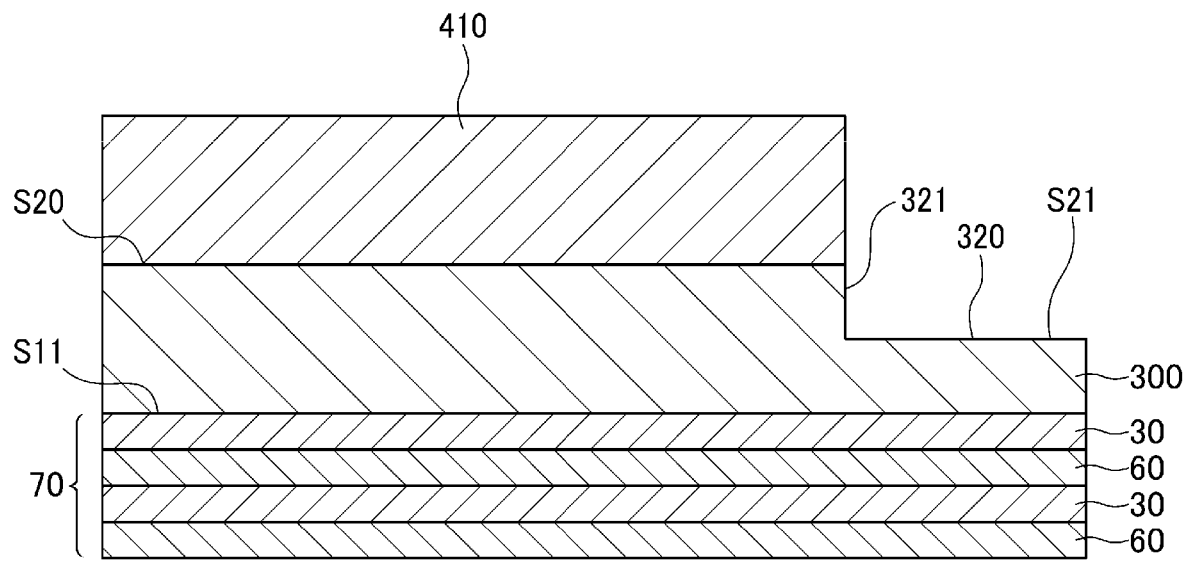
FIG. 17 is a cross-sectional view illustrating a method for manufacturing the semiconductor storage device illustrated in FIG. 1.

In a mask recess forming step performed after the first resist forming step, anisotropic etching is performed on the etching mask 300 and the antireflection film 410. Therefore, the portion immediately below the opening 421 is etched and the recess 320 is formed in the etching mask 300. After the recess 320 is formed, the resist film 420 is removed by asking. FIG. 17 illustrates a state where the mask recess forming step is completed.

[Increasing Step]

Figure 18:
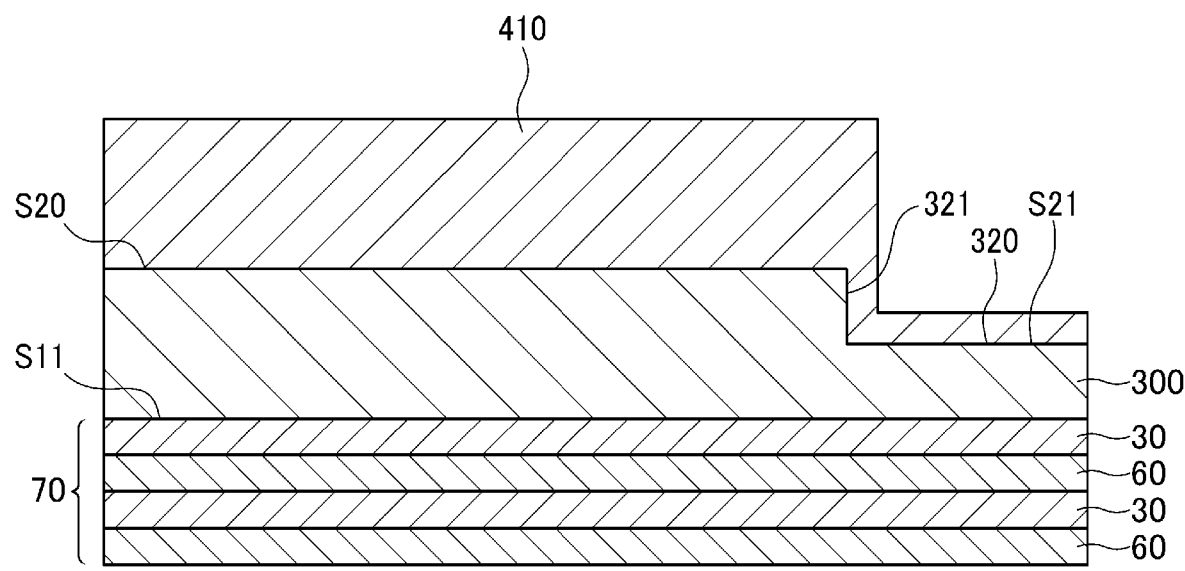
FIG. 18 is a cross-sectional view illustrating a method for manufacturing the semiconductor storage device illustrated in FIG. 1.

In an increasing step performed after the mask recess forming step, the antireflection film 410 is formed on the entire surface exposed on the upper side in a state in FIG. 17 by, for example, CVD. Therefore, in the portion where the antireflection film 410 is formed in advance, the antireflection film 410 is added and thickened. Further, the portion where the antireflection film 410 is not formed in advance, that is, the surface S21 of the recess 320 or the end portion 321 exposed in FIG. 17 is covered by the newly formed antireflection film 410. FIG. 18 illustrates a state where the stacking step is completed.

[Coating Film Forming Step]

Figure 19:
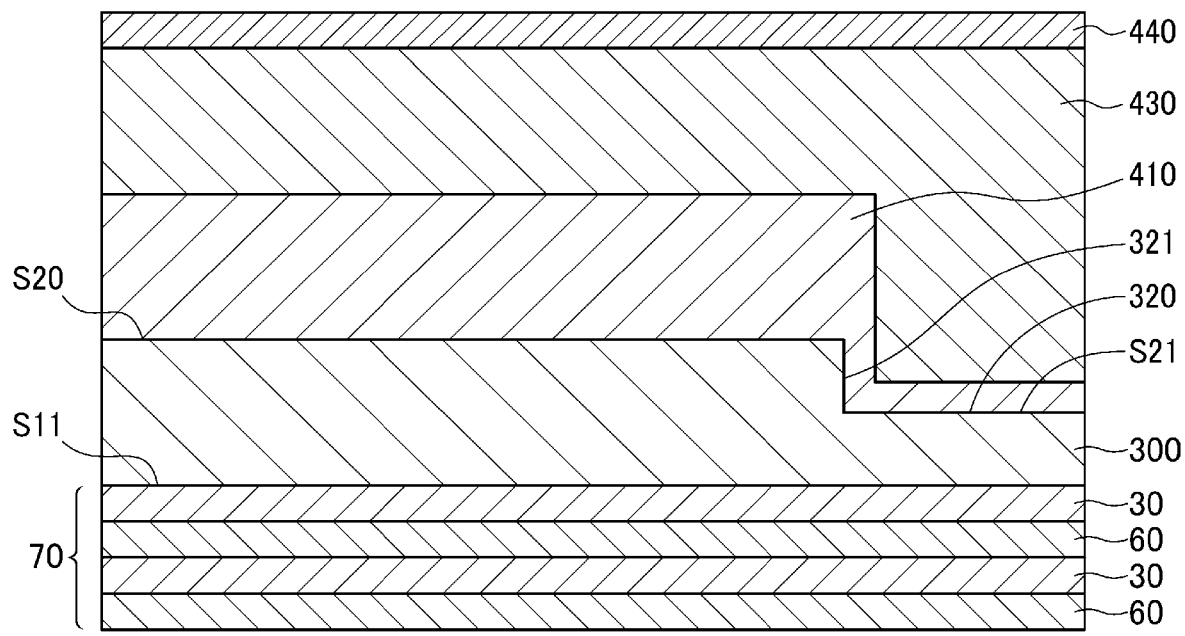
FIG. 19 is a cross-sectional view illustrating a method for manufacturing the semiconductor storage device illustrated in FIG. 1.

In a coating film forming step performed after the increasing step, a coating film is formed on the entire surface exposed on the upper side in a state in FIG. 18. In the embodiment, a spin on carbon (SOC) film 430 and a spin on glass (SOG) film 440 are formed in the order as the coating film. FIG. 19 illustrates a state where the coating film forming step is completed.

The SOC film 430 is a carbon-based coating type hard mask, and the SOG film 440 is a silicon-based coating type hard mask. The surface of the SOG film 440 formed on the uppermost side is a flat surface as a whole, including a portion covering the recess 320.

[Second Resist Forming Step]

Figure 20:
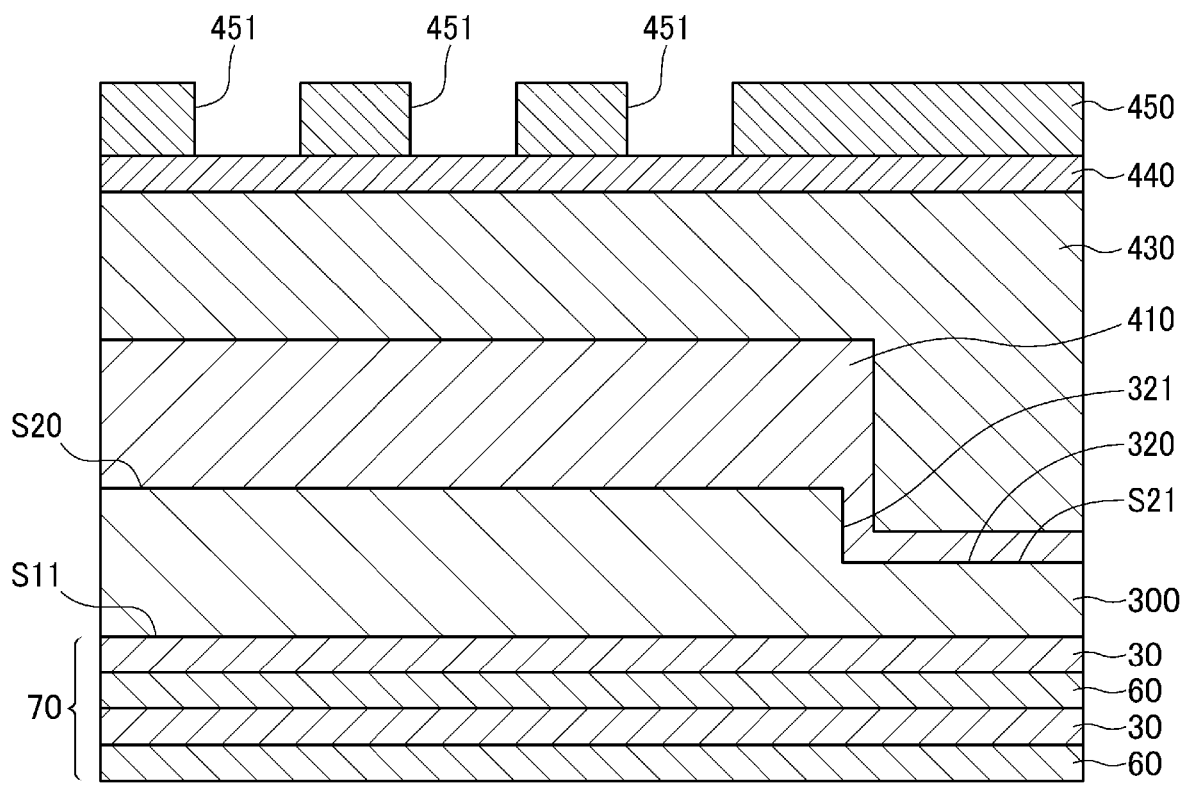
FIG. 20 is a cross-sectional view illustrating a method for manufacturing the semiconductor storage device illustrated in FIG. 1.

In a second resist forming step performed after the coating film forming step, a resist film 450 is formed to cover the surface of the SOG film 440. Thereafter, each of portions of the resist film 450 corresponding to the through via holes 310 is removed by exposing and etching the resist film 450. FIG. 20 illustrates a state where the second resist forming step is completed. The term "portions of the resist film 450 corresponding to the through via holes 310" refers to portions that covers immediately above the portion where the through via holes 310 are formed in the etching mask 300 in the subsequent mask processing step. An opening formed in the resist film 450 by the above etching is also referred to as an "opening 451."

[Coating Film Processing Step]

Figure 21:
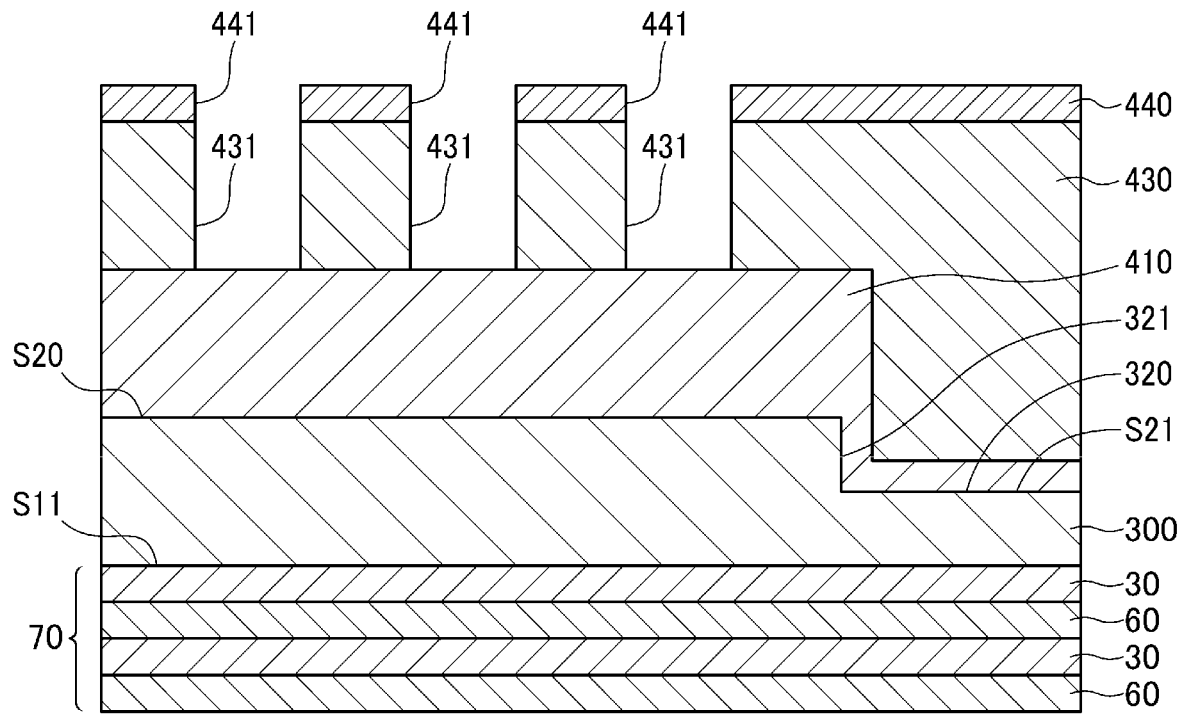
FIG. 21 is a cross-sectional view illustrating a method for manufacturing the semiconductor storage device illustrated in FIG. 1.

In a coating film processing step performed after the second resist forming step, anisotropic etching is performed on the SOC film 430 and the SOG film 440, which are the coating films. Therefore, portions of the SOG film 440 exposed immediately below the openings 451 are etched and through via holes 441 are formed. Further, portions of the SOC film 430 exposed immediately below the openings 451 are etched and through via holes 431 are formed. FIG. 21 illustrates a state where the coating film processing step is completed.

A carbon-based material similar to that of the SOC film 430 is used as a material of the resist film 450. As a result, the resist film 450 on the surface is also etched together with the SOC film 430 in the coating film processing step. As illustrated in FIG. 21, the resist film 450 is completely removed at the time when the coating film processing step is completed.

[Antireflection Film Processing Step]

Figure 22:
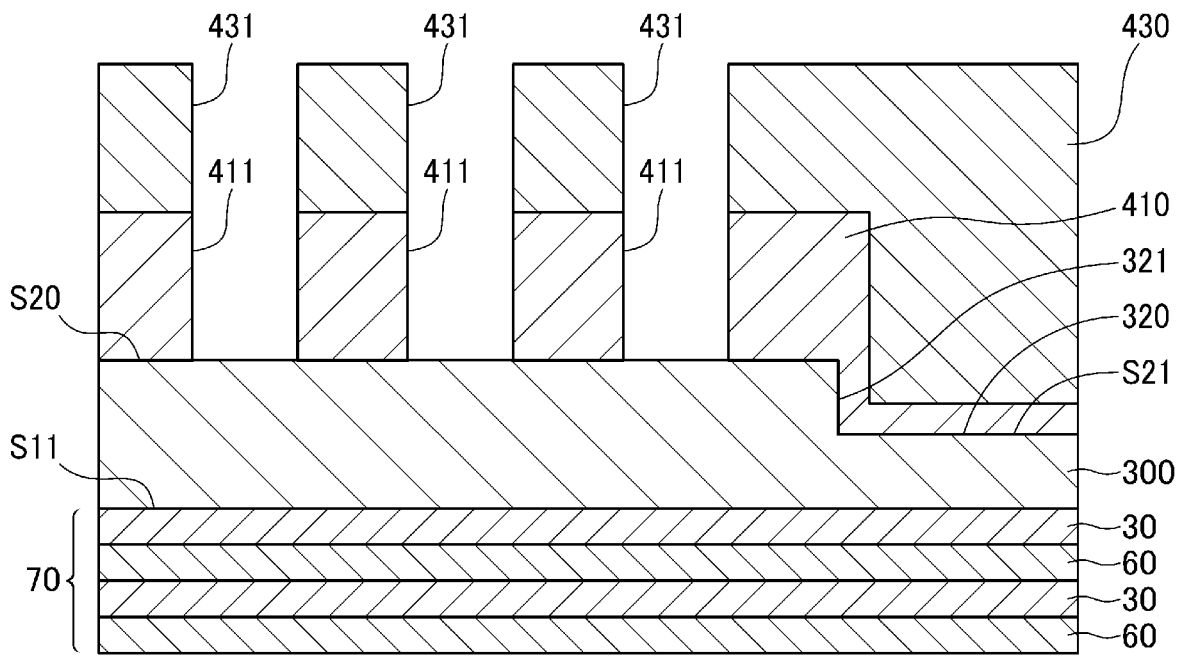
FIG. 22 is a cross-sectional view illustrating a method for manufacturing the semiconductor storage device illustrated in FIG. 1.

In an antireflection film processing step performed after the coating film processing step, anisotropic etching is performed on the antireflection film 410. Therefore, portions of the antireflection film 410 exposed immediately below the through via holes 431 are etched and through via holes 411 are formed. FIG. 22 illustrates a state where the antireflection film processing step is completed.

Since a silicon-based material is used as the material of the SOG film 440, the SOG film 440 on the surface is also etched together with the antireflection film 410 in the antireflection film processing step. As illustrated in FIG. 22, the SOG film 440 is completely removed at the time when the antireflection film processing step is completed.

[Mask Through Via Hole Processing Step]

Figure 23:
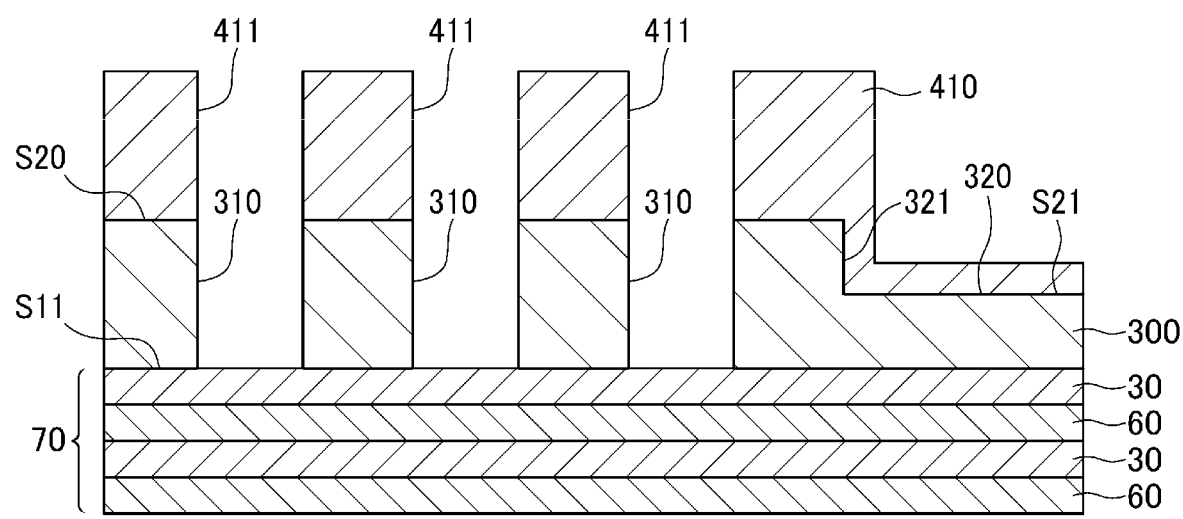
FIG. 23 is a cross-sectional view illustrating a method for manufacturing the semiconductor storage device illustrated in FIG. 1.

In a mask through via hole processing step performed after the antireflection film processing step, anisotropic etching is performed on the etching mask 300. Therefore, portions of the etching mask 300 exposed immediately below the through via holes 411 are etched and the through via holes 310 are formed. FIG. 23 illustrates a state where the mask through via hole processing step is completed.

A carbon-based material similar to that of the etching mask 300 is used as a material of the SOC film 430. As a result, the SOC film 430 on the surface is also etched together with the etching mask 300 in the mask through via hole processing step. As illustrated in FIG. 23, the SOC film 430 is completely removed at the time when the mask through via hole processing step is completed. However, even when the SOC film 430 is completely removed, the entire surface S21 of the recess 320 of the etching mask 300 is covered with and protected by the antireflection film 410. As a result, the surface S21 is not etched during the execution of the mask through via hole processing step.

After the mask through via hole processing step is completed, the entire antireflection film 410 is removed by etch back. Therefore, the entire mask processing step is completed, and the etching mask 300 is in the state illustrated in FIG. 5.

As described above, in the mask processing step of the embodiment, the through via holes 310 and the recess 320 are respectively formed in the etching mask 300 by going through the antireflection film forming step, the first resist forming step, the mask recess forming step, the increasing step, the coating film forming step, the second resist forming step, the coating film processing step, the antireflection film processing step, and the mask through via hole processing step, which have been described, in the order. In the mask processing step of the embodiment, first, the recess 320 is formed, and then, the through via hole 310 is formed. However, the order in which the recess 320 and the through via hole 310 are formed may be different from the above.

In the embodiment, the recess 320 is formed in the etching mask 300 by the mask processing step as described above. Therefore, the influence of the loading effect may be reduced as already described, and thus, a plurality of recesses 71 may be processed substantially at the same etching rate in the recess forming step.

As already described with reference to FIG. 14, in the mask processing step of the embodiment, when viewed along the direction perpendicular to the surface S20 of the etching mask 300, the recess 320 is formed such that the first area side end portion 321 of the recess 320 is in parallel with the boundary BD between the first area and the second area. Therefore, the distance (L30 in the example in FIG. 14) to the recess 320 becomes equal in all the first through via holes 310A that are easily affected by the loading effect. As a result, the etching rate of all the through via holes 310 including each first through via hole 310A may be made further closer to uniformity.

Further, as already described with reference to FIG. 14, in the mask processing step of the embodiment, each of the through via holes 310 and the recess 320 are formed such that the shortest distance from the edge of the first through via hole 310A to the edge of the second through via hole 310B and the shortest distance from the edge of the first through via hole 310A to the recess 320 are equal to each other. With this configuration, the shape of the etching mask 300 that exists around the first through via hole 310A and the shape of the etching mask 300 that exists around the second through via hole 310B are in agreement with each other in the shape, and thus, the etching rate of all the through via holes 310 may be made further closer to uniformity.

According to the manufacturing method according to the embodiment, since the influence of the loading effect in the recess forming step is reduced, the shape of the first through via hole 310A does not need to be different from the shape of the other through via holes 310. Therefore, as described with reference to FIG. 13 and FIG. 14, in the mask processing step, it is possible to form each of the through via holes 310 such that the shape of the first through via holes 310A and the shape of the second through via holes 310B are equal to each other. Further, when viewed along the direction perpendicular to the surface S20 of the etching mask 300, it is possible to form each of the through via holes 310 such that the shortest distance from the edge of the first through via hole 310A to the edge of the second through via hole 310B and the shortest distance from the edge of the second through via hole 310B to the edge of the third through via hole 310C are equal to each other.

A configuration of the semiconductor storage device 10 manufactured through the manufacturing steps as described above will be described with reference to FIG. 2 again. As illustrated in FIG. 2, when viewed along the direction perpendicular to the surface S10 of the stacked portion 50, the memory pillar 100 formed at the position closest to the boundary BD between the first area and the second area of the stacked portion 50 is also referred to as a "first memory pillar 100A" in the following. Further, the memory pillar 100 formed at the position adjacent to the first memory pillar 100A along the direction perpendicular to the boundary BD is also referred to as a "second memory pillar 100B" in the following. Further, the memory pillar 100 formed at the position adjacent to the second memory pillar 100B along the same direction, and formed at the position on the side opposite to the first memory pillar 100A is also referred to as a "third through via hole 100C" in the following.

In the embodiment, in the mask processing step, the through via holes 310 are formed into the same shape as each other, and, as a result, the memory holes MH in each of which the memory pillar 100 is to be disposed is formed into the same shape as each other.

As a result, as illustrated in FIG. 2, in the semiconductor storage device 10, the shape of the first memory pillar 100A in the surface S10 of the stacked portion 50 and the shape of the second memory pillar 100B in the surface S10 are equal to each other. In FIG. 2, the diameter of each memory pillar 100 in the surface S10 is referred to as "D10." In the semiconductor storage device 10, not only the first memory pillar 100A and the second memory pillar 100B described above, but also all the memory pillars 100 have the same diameter equal to D10 in the surface S10. D10 is a dimension substantially equal to D30 (see FIG. 14), which is the inner diameter of the through via hole 310 formed in the etching mask 300.

The shape of the first memory pillar 100A in the surface S10 and the shape of the second memory pillar 100B in the surface S10 do not have to be completely the same as each other. At least the width of the first memory pillar 100A and the width of the second memory pillar 100B may be the same as each other in the surface S10. The term "width" in the above refers to as, for example, the outer diameter dimension of the first memory pillar 100A or the second memory pillar 100B along the direction (left-right direction in FIG. 2) perpendicular to the boundary BD.

In the embodiment, in the mask processing step, each of the through via holes 310 is formed such that the distances between the through via holes 310 adjacent to each other along the direction perpendicular to the boundary BD are equal to each other. As a result, the distances between the memory holes MH in each of which the memory pillars 100 are to be disposed are equal to each other.

As a result, as illustrated in FIG. 2, in the semiconductor storage device 10, the shortest distance from the edge of the first memory pillar 100A to the edge of the second memory pillar 100B and the shortest distance from the edge of the second memory pillar 100B to the edge of the third memory pillar 100C become equal to each other in the surface S10.

In FIG. 2, the distance between each of the memory pillars 100 is referred to as "L10." In the semiconductor storage device 10, not only the distance between the first memory pillar 100A and the second memory pillar 100B described above, or the distance between the second memory pillar 100B and the third memory pillar 100C, but also all the distances between the through via holes 310 adjacent to each other along the direction perpendicular to the boundary BD are equal to L10. L10 is a dimension substantially equal to L30 (see FIG. 14), which is the distance between the through via holes 310 formed to be adjacent to each other in the etching mask 300.

As described above, in the semiconductor storage device 10 according to the embodiment, all the memory pillars 100 including the first memory pillar 100A formed at the position closest to the boundary BD have the same shape as each other, and are arranged at equal intervals. As a result, in consideration of the influence of the loading effect, it is possible to prevent the increase in size of the semiconductor storage device 10 as compared with the configuration in the related art in which the shape or the arrangement of some of the memory pillars 100 is different from the others.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor storage device comprising:
forming a workpiece by alternately stacking an insulating layer and a sacrificial layer;
forming an etching mask on a surface of the workpiece;
forming a plurality of through via holes extending to a surface of the workpiece in a first area of the etching mask; and
forming a recess obtained by retracting a part of the surface of the etching mask toward the workpiece in a concave shape in a second area of the etching mask that is adjacent to the first area,
wherein, when viewed from a direction perpendicular to a surface of the etching mask, the recess is formed such that an end portion of the recess on a side of the first area is in parallel with a boundary between the first area and the second area,
wherein, when viewed from the direction perpendicular to the surface of the etching mask, a first through via hole of the plurality of through via holes formed at a position closest to the boundary between the first area and the second area has the same width at a same height position as a width of a second through via hole of the plurality of through via holes formed at a position adjacent to the first through via hole along a direction perpendicular to the boundary,
wherein each of the through via holes of the plurality of through via holes and the recess are formed such that a shortest distance from an edge of the first through via hole to an edge of the second through via hole and a shortest distance from the edge of the first through via hole to the recess are equal to each other.

2. The method according to claim 1, wherein each of the through via holes is formed such that when viewed from the direction perpendicular to the surface of the etching mask, a third through via hole of the plurality of through via holes positioned at a position adjacent to the second through via hole and at a position on a side opposite to the first through via hole along a direction perpendicular to a boundary between the first area and the second area has the same shortest distance from an edge of the second through via hole as a shortest distance from the first through via hole to an edge of the second through via hole.

3. The method according to claim 2, wherein the third through via hole and the second through via hole have the same shape.

4. The method according to claim 2, wherein
each of the second through via hole and the third through via hole has a shape of a circular cylinder, and
the third through via hole and the second through via hole have the same diameter.

5. The method according to claim 1, wherein the first through via hole and the second through via hole have the same shape.

6. The method according to claim 1, wherein
each of the first through via hole and the second through via hole has a shape of a circular cylinder, and
the second through via hole and the first through via hole have the same diameter.

7. A method for manufacturing a semiconductor storage device comprising:
forming a workpiece by alternately stacking an insulating layer and a sacrificial layer;
forming an etching mask on a surface of the workpiece;
forming a plurality of through via holes extending to a surface of the workpiece in a first area of the etching mask; and
forming a recess obtained by retracting a part of the surface of the etching mask toward the workpiece in a concave shape in a second area of the etching mask that is adjacent to the first area,
wherein, when viewed from a direction perpendicular to a surface of the etching mask, the recess is formed such that an end portion of the recess on a side of the first area is in parallel with a boundary between the first area and the second area,
wherein, when viewed from the direction perpendicular to the surface of the etching mask, a first through via hole of the plurality of through via holes formed at a position closest to the boundary between the first area and the second area has the same width at a same height position as a width of a second through via hole of the plurality of through via holes formed at a position adjacent to the first through via hole along a direction perpendicular to the boundary,
wherein each of the through via holes of the plurality of through via holes and the recess are formed such that when viewed from the direction perpendicular to the surface of the etching mask, a fourth through via hole of the plurality of through via holes formed at a position closest to the boundary between the first area and the second area has the same distance from the recess as a distance of the first through via hole from the recess.

8. A method for manufacturing a semiconductor storage device comprising:
forming a workpiece by alternately stacking an insulating layer and a sacrificial layer;
forming an etching mask on a surface of the workpiece;
forming a plurality of through via holes extending to a surface of the workpiece in a first area of the etching mask; and
forming a recess obtained by retracting a part of the surface of the etching mask toward the workpiece in a concave shape in a second area of the etching mask that is adjacent to the first area,
wherein, when viewed from a direction perpendicular to a surface of the etching mask, the recess is formed such that an end portion of the recess on a side of the first area is in parallel with a boundary between the first area and the second area,
wherein each of the through via holes of the plurality of through via holes and the recess are formed such that a shortest distance from an edge of the first through via hole to an edge of the second through via hole and a shortest distance from the edge of the first through via hole to the recess are equal to each other.

* * * * *